(12) United States Patent
Torii et al.

(10) Patent No.: US 7,348,715 B2
(45) Date of Patent: Mar. 25, 2008

(54) PIEZOELECTRIC ELEMENT AND METHOD FOR MANUFACTURING THE SAME, AND INK JET HEAD AND INK JET RECORDING APPARATUS USING THE PIEZOELECTRIC ELEMENT

(75) Inventors: Hideo Torii, Osaka (JP); Eiji Fujii, Osaka (JP); Takeshi Kamada, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 257 days.

(21) Appl. No.: 11/043,704

(22) Filed: Jan. 26, 2005

(65) Prior Publication Data

US 2005/0162047 A1     Jul. 28, 2005

(30) Foreign Application Priority Data

Jan. 27, 2004    (JP) .............................. 2004-018017

(51) Int. Cl.
*B41J 2/045* (2006.01)
*H01L 41/187* (2006.01)

(52) U.S. Cl. ........................................ 310/358; 347/68
(58) Field of Classification Search ................ 310/358, 310/324; 347/68–72
See application file for complete search history.

(56) References Cited

U.S. PATENT DOCUMENTS 6,121,647 A    9/2000    Yano et al.

2003/0222947 A1*    12/2003    Tomozawa et al. ........... 347/68

FOREIGN PATENT DOCUMENTS

| EP | 1376711 A2 | 1/2004 |
|---|---|---|
| JP | 04-349675 A | 12/1992 |
| JP | 10-290033 A | 10/1998 |
| JP | 10279355 A * | 10/1998 |
| JP | 2000-043259 A | 2/2000 |
| WO | WO-02/055450 A1 | 7/2002 |

OTHER PUBLICATIONS

Vasant Kumar, C. V. R., et al.; "Crystallization of sputtered lead zirconate titanate films by rapid thermal processing"; Journal of Applied Physics; USA; vol. 71, No. 2; Jan. 15, 1992; pp. 864-874; XP002371777; ISSN: 0021-8979.

* cited by examiner

*Primary Examiner*—J. San Martin
(74) *Attorney, Agent, or Firm*—Harness, Dickey & Pierce, P.L.C.

(57) ABSTRACT

A lead content in a piezoelectric thin film (3) of a piezoelectric element (20) is made smaller as compared to stoichiometric composition. More specifically, the piezoelectric thin film (3) is made of lead zirconate titanate expressed as $Pb_{(1-x)}(Zr_{(1-s)}Ti_s)O_3$ (0<s<1) or lead-zirconate-titanate-based oxide expressed as $(Pb_{(1-x-y)}A_y)(Zr_{(1-s-t)}Ti_sB_t)O_3$ (0<s<1, 0<t<1-s) where A is a substitutive metal ion in an A-site in the perovskite crystalline structure and B is a substitutive metal ion in a B-site in the perovskite crystalline structure. The value of x, which indicates a deficiency in Pb content in each composition, is more than 0 but not more than 0.15.

10 Claims, 7 Drawing Sheets

PIEZOELECTRIC ELEMENT AND METHOD FOR MANUFACTURING THE SAME, AND INK JET HEAD AND INK JET RECORDING APPARATUS USING THE PIEZOELECTRIC ELEMENT

CROSS-REFERENCE TO RELATED APPLICATION

The disclosure of Japanese Patent Application No. 2004-018017 filed on Jan. 27, 2004 including specification, drawings and claims is incorporated herein by reference in its entirety.

BACKGROUND OF THE INVENTION

1. Field of the Invention

The present invention relates to a piezoelectric element having an electro-mechanical conversion function and a method for manufacturing the same, and an ink jet head and an ink jet recording apparatus using the piezoelectric element.

2. Description of the Prior Art

Generally, a piezoelectric element has a layered structure in which a piezoelectric material is interposed between two electrodes in the thickness direction. A piezoelectric material is made of a material capable of converting a mechanical energy to an electrical energy and vice versa. Typical examples of a piezoelectric material include lead zirconate titanate ($Pb(Zr,Ti)O_3$) (hereinafter referred to as "PZT"), which is an oxide having a perovskite crystalline structure, and substances obtained by adding magnesium, manganese, nickel, niobium or the like to PZT.

In the case of PZT having a perovskite tetragonal crystalline structure, in particular, the greatest piezoelectric displacement is obtained in the <001> axis direction (i.e., the c axis direction). However, many of the piezoelectric materials are polycrystals made up of a collection of crystal grains, and the crystallographic axes of the crystal grains are oriented randomly. Therefore, the spontaneous polarizations Ps are also arranged randomly. Nevertheless, piezoelectric elements are manufactured so that the sum of these vectors is in a direction parallel with an electric field. In a piezoelectric actuator (formed by providing a vibration plate on the layered structure), which is one form of piezoelectric element, if a voltage is applied across the two electrodes, a mechanical displacement which is proportional to the magnitude of that voltage is obtained.

However, if a high voltage is applied to the piezoelectric element that has been subjected to a high humidity atmosphere for a long time, the electrical insulation of the piezoelectric material is decreased, resulting in a dielectric breakdown. This phenomenon has been one of the major problems in achieving the reliability of the piezoelectric element.

In order to prevent the occurrence of this kind of phenomenon, various measures have been taken so far. In particular, to avoid the occurrence of electrode material migration, which is considered to be most closely related to dielectric breakdown, selecting, as the electrode material, gold or platinum in which migration is not likely to occur, has been considered.

Nevertheless, it has become clear that even if electrode material migration is prevented by using gold or platinum as the electrode material, the insulation resistance of the piezoelectric material decreases. In other words, this insulation resistance decrease results from the fact that water directly attacks the piezoelectric material. As a method for preventing this decrease, it has been proved that if the entire body of a piezoelectric element is placed in a metallic airtight container in which a desiccating agent is provided and then the container is sealed completely, insulation deterioration does not occur in the piezoelectric material (see Japanese Laid-Open Publication No. 4-349675).

Along with the recent downsizing of electronic appliances, there is a strong demand for reducing the size of piezoelectric elements. In order to meet the demand, more piezoelectric elements are used in the form of thin films whose volumes are significantly reduced from those of sinters, which have conventionally been used in various applications, and active researches and developments have been made for reducing the thickness of piezoelectric elements. Examples of PZT film formation methods include a sputtering method, a CVD method, a sol-gel method, or the like. By these methods, piezoelectric thin films with excellent characteristics can be obtained, if special consideration is given to oxygen concentration adjustment or heat treatment conditions.

For the purpose of downsizing, it also is desired that a piezoelectric element is not placed in a metallic airtight container as mentioned above, but is used in an uncovered state. To meet this demand, measures have also been taken to prevent a piezoelectric element from deteriorating even if it is used in a high humid environment without being placed in a metallic container. For example, a method has been proposed in which a heat generating film is provided alongside a piezoelectric layer that forms a piezoelectric element, so that the heat generating film positively heats the piezoelectric layer, thereby preventing the piezoelectric layer from absorbing moisture (see Japanese Laid-Open Publication No. 2000-43259).

Piezoelectric elements which contain a lead compound such as PZT are synthesized at high temperature. This is true for piezoelectric elements in the form of thin films. Considering that the vapor pressure of lead is high at high temperature, a PZT thin film, for example, is typically made to have a composition in which lead is contained excessively to some degree as compared with PZT of stoichiometric composition (whose chemical composition formula is $Pb(Zr_{1-x}Ti_x)O_3 (0<x<1)$ and chemical composition proportion is Pb:Zr+Ti: O=1:1:3) (see Japanese Laid-Open Publication No. 10-290033, for example).

The present inventors examined why a piezoelectric element, which uses such a piezoelectric thin film containing an excessive amount of lead, has a dielectric breakdown when a high voltage is applied to the piezoelectric element in a high humidity environment, and found out the following mechanism. More specifically, a piezoelectric thin film is often made up of a collection of columnar crystal grains oriented from one side to the other side in the thickness direction of the piezoelectric thin film fabricated by a sputtering method, for example. The boundaries of these columnar crystal grains exist as grain boundaries. Even a piezoelectric thin film, which is not in the form of a columnar crystal grain collection, also has many grain boundaries. The present inventors then found that in the grain boundaries in a piezoelectric material, excessive lead is present in the form of an oxide and that the lead oxide existing in the grain boundaries electrochemically reacts with water content absorbed as moisture and then changes in quality. They considered that the cause of the occurrence of dielectric breakdown in the conventional piezoelectric element was that water content passed through pinholes in the electrode films into the grain boundaries in the piezoelectric thin film to cause lead oxide present in the grain boundaries to react with the water content and change into hydroxide lead and then into lead dioxide, which possesses electrical conductivity.

From this consideration, it is found that this problem can be overcome by eliminating the direct attack by the water content on the piezoelectric material that contains a lead compound such as PZT. To that end, the following method is possible. In fabricating a piezoelectric element, after formation of a layered structure of a piezoelectric material and first and second electrodes, either the first or second electrode is exposed to a chemical substance such as zirconium alkoxide, zirconium acetylacetonate, or zirconium carboxylate so that the chemical substance is absorbed into the piezoelectric thin film through the electrode, whereby lead oxide or hydroxide lead present in the grain boundaries in the piezoelectric thin film is covered by electrochemically stable zirconium oxide, thereby preventing leakage current from passing through the grain boundaries. In this manner, the grain boundaries are covered by the insulating film made of zirconium oxide, such that the electrochemical characteristic of the grain boundaries is controlled by the zirconium oxide existing in the grain boundaries. This allows the grain boundaries to be in an electrochemically stable state, thereby preventing the occurrence of dielectric breakdown in which leakage current passes through the grain boundaries. In this way, the occurrence of dielectric breakdown is prevented even at high humidity.

However, in the above method, since zirconia processing or the like has to be performed after the formation of the layered structure, the fabrication process becomes complicated.

SUMMARY OF THE INVENTION

In view of the above points, the present invention was made and an object of the present invention is to make it easy to obtain a highly reliable piezoelectric element, in which insulation does not deteriorate, even if the element is driven at a high voltage in a high humidity environment.

In order to achieve the above object, the amount of lead contained in a piezoelectric thin film is smaller than that contained in stoichiometric composition.

Specifically, a first invention is applicable to a piezoelectric element which includes a layered structure in which a first electrode film, a piezoelectric thin film, and a second electrode film are layered in this order.

The piezoelectric thin film is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3 (0<s<1)$, the lead-zirconate-titanate-based oxide having a chemical composition expressed by a chemical formula $(Pb_{(1-x-y)}A_y)(Zr_{(1-s-t)}Ti_sB_t)O_3 (0<s<1, 0<t<1-s)$ where A is a substitutive metal ion in an A-site in the perovskite crystalline structure and B is a substitutive metal ion in a B-site in the perovskite crystalline structure. The value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15.

Then, the lead content in the composition of the piezoelectric thin film that forms the piezoelectric element is smaller as compared with the stoichiometric composition, such that lead oxide which undergoes a chemical reaction with water content in the atmosphere is not present in the grain boundaries in the piezoelectric thin film. As a result, even if the piezoelectric element is driven by application of a voltage in a high humidity environment, degradation resulting from insulation deterioration does not occur. Moreover, the piezoelectric thin film having the low-lead-content composition is easily obtained just by appropriately setting sputtering conditions (see seventh and eighth inventions described below) and zirconia processing or the like is not necessary. Accordingly, the highly reliable piezoelectric element is obtained easily.

According to a second invention, in the first invention A in the chemical composition formula of the lead-zirconate-titanate-based oxide is at least one metal ion selected from the group consisting of lanthanum (La), strontium (Sr), bismuth (Bi), and calcium (Ca), and B in the chemical composition formula is at least one metal ion selected from the group consisting of niobium (Nb), magnesium (Mg), nickel (Ni), manganese (Mn), and iron (Fe).

Then, the piezoelectric thin film having various kinds of properties is obtained, thereby realizing a piezoelectric element having characteristic piezoelectric properties.

According to a third invention, in the first invention the thickness of the piezoelectric thin film is 2 μm or more but 6 μm or less.

Then, the piezoelectric thin film having stable displacement and high reliability in normal use is obtained easily.

According to a fourth invention, in the first invention the piezoelectric thin film is preferentially oriented along a (001) plane.

Then, the polarization direction of the crystal grains of the piezoelectric thin film is oriented in one direction, thereby allowing the piezoelectric element to exhibit stable displacement in response to an applied voltage.

According to a fifth invention, in the first invention a vibration plate is provided on one surface of the layered structure in the film-layering direction.

According to a sixth invention, in the fifth invention the vibration plate is made of at least one material selected from the group consisting of silicon, glass, ceramic material, and metal material.

By the fifth and sixth inventions, a highly reliable piezoelectric element (piezoelectric actuator) which is displaced in the film-layering direction of the layered structure by application of a voltage between the first and second electrode films is easily attained.

A seventh invention is a piezoelectric element manufacturing method including the step of forming a first electrode film on a substrate, the step of forming a piezoelectric thin film on the first electrode film by a sputtering method, and the step of forming a second electrode film on the piezoelectric thin film.

In this invention, the piezoelectric thin film is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3 (0<s<1)$, the lead-zirconate-titanate-based oxide having a chemical composition expressed by a chemical formula $(Pb_{(1-x-y)}A_y)(Zr_{(1-s-t)}Ti_sB_t)O_3 (0<s<1, 0<t<1-s)$ where A is a substitutive metal ion in an A-site in the perovskite crystalline structure and B is a substitutive metal ion in a B-site in the perovskite crystalline structure, the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15, and in the piezoelectric thin film formation step, the piezoelectric thin film is formed under sputtering conditions in which the substrate with the first electrode film formed thereon is made to have a potential which floats electrically so as not to be fixed at ground potential, and a sputtering gas pressure is 0.05 Pa or more but 0.15 Pa or less.

Specifically, the present inventors made the following findings. A piezoelectric thin film containing a smaller amount of lead in its composition can be formed in the piezoelectric thin film formation step, if, among the particles of the composition elements ejected from the target onto the substrate by the sputtering gas during the sputter deposition process, the particles of the lead element having a high vapor pressure are reduced in deposition rate. To that end, it is effective that the substrate is subjected to ion bombardment for directing the sputtered particles at the substrate. More specifically, the following methods can be taken. One method is that when the potential of the substrate is electrically floating so as not to be fixed at the ground potential (i.e., the substrate is not grounded and is not electrically connected to any other members), the degree of vacuum during the sputter deposition process is increased (i.e., the sputtering gas pressure is decreased) so as to reduce the probability of collision between the sputtered particles and the gas molecules present in the space between the substrate and the target, thereby subjecting the substrate to the ion bombardment. Alternative method is that the potential of the substrate is made equal to the ground potential or made to be a negative potential lower than the ground potential, so that the sputtered particles are electrically attracted to the substrate, thereby subjecting the substrate to the ion bombardment. In the seventh invention, the sputtering gas pressure is set as low as 0.15 Pa or less, so that the substrate is subjected to ion bombardment, which allows a piezoelectric thin film with a smaller lead content to be formed easily. Accordingly, the highly reliable piezoelectric element of the first invention can be mass-produced easily. It should be noted that the sputtering gas pressure is set to 0.05 Pa or more for the reason that if the sputtering gas pressure is less than 0.05 Pa, generation of plasma becomes difficult when the film is deposited in a sputtering apparatus.

An eighth invention is applicable to a piezoelectric element manufacturing method including the step of forming a first electrode film on a substrate, the step of forming a piezoelectric thin film on the first electrode film by a sputtering method, and the step of forming a second electrode film on the piezoelectric thin film.

The piezoelectric thin film is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3(0<s<1)$, the lead-zirconate-titanate-based oxide having a chemical composition expressed by a chemical formula $(Pb_{(1-x-y)}A_y)(Zr_{(1-s-t)}Ti_sB_t)O_3(0<s<1, 0<t<1-s)$ where A is a substitutive metal ion in an A-site in the perovskite crystalline structure and B is a substitutive metal ion in a B-site in the perovskite crystalline structure, the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15, and in the piezoelectric thin film formation step, the piezoelectric thin film is formed under sputtering conditions in which a bias voltage is applied to the substrate, on which the first electrode film has been formed, so that the substrate has a potential equal to ground potential or has a negative potential lower than the ground potential.

Then, sputtered particles are electrically attracted to the substrate, such that the substrate is subjected to the ion bombardment, thereby forming a piezoelectric thin film which contains a smaller amount of lead in its composition, as described above. In particular, if the substrate has a negative potential lower than ground potential, the sputtered particles are electrically attracted to the substrate more powerfully. As a result, the substrate is subjected to considerably strong ion bombardment, whereby a piezoelectric thin film with a smaller lead content is formed more reliably and more easily. Therefore, this invention, like the seventh invention, enables a highly reliable piezoelectric element to be mass produced easily.

A ninth invention is an ink jet head which includes: a piezoelectric element including a layered structure, in which a first electrode film, a piezoelectric thin film and a second electrode film are layered in this order, and a vibration plate provided on one surface of the layered structure in the film-layering direction; a pressure chamber for storing ink therein; and a nozzle communicated to the pressure chamber, the ink jet head being designed so that the vibration plate is displaced in a thickness direction by a piezoelectric effect of the piezoelectric thin film of the piezoelectric element so that the ink in the pressure chamber is discharged through the nozzle.

In this invention, the piezoelectric thin film of the piezoelectric element is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3(0<s<1)$, the lead-zirconate-titanate-based oxide having a chemical composition expressed by a chemical formula $(Pb_{(1-x-y)}A_y)(Zr_{(1-s-t)}Ti_sB_t)O_3(0<s<1, 0<t<1-s)$ where A is a substitutive metal ion in an A-site in the perovskite crystalline structure and B is a substitutive metal ion in a B-site in the perovskite crystalline structure, and the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15.

By this invention, an ink jet head having very high reliability and durability is easily obtained.

A tenth invention is an ink jet recording apparatus which includes: an ink jet head including: a piezoelectric element including a layered structure, in which a first electrode film, a piezoelectric thin film and a second electrode film are layered in this order, and a vibration plate provided on one surface of the layered structure in the film-layering direction; a pressure chamber for storing ink therein; and a nozzle communicated to the pressure chamber; and relative movement means for relatively moving the ink jet head and a recording medium with respect to each other, the ink jet recording apparatus being designed so that while the ink jet head is relatively moved with respect to the recording medium, the vibration plate is displaced in a thickness direction by a piezoelectric effect of the piezoelectric thin film of the piezoelectric element of the ink jet head so that the ink in the pressure chamber is discharged through the nozzle onto the recording medium, thereby recoding information.

In this invention, the piezoelectric thin film of the piezoelectric element of the ink jet head is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3$ (0<s<1), the lead-zirconate-titanate-based oxide having a chemical composition expressed by a chemical formula $(Pb_{(1-x-y)}A_y)(Zr_{(1-s-t)}Ti_sB_t)O_3$ (0<s<1, 0<t<1-s) where A is a substitutive metal ion in an A-site in the perovskite crystalline structure and B is a substitutive metal ion in a B-site in the perovskite crystalline structure, and the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15.

By this invention, a highly reliable ink jet recording apparatus in which deviation in ink discharge is small is obtained easily.

According to an eleventh invention, in the tenth invention the relative movement means includes head moving means for reciprocating the ink jet head in a predetermined direction and recording medium moving means for moving the recording medium in a direction substantially perpendicular to the predetermined direction, and while the ink jet head is moved in the predetermined direction by the head moving means of the relative movement means, the ink in the pressure chamber is discharged through the nozzle of the ink jet head onto the recording medium, thereby recoding information.

Then, an ink jet recording apparatus whose ink jet head performs reciprocating motion is obtained easily.

According to a twelfth invention, in the tenth invention a plurality of ink jet heads are aligned and connected with each other in a predetermined direction, and relative movement means moves a recording medium in a direction substantially perpendicular to the predetermined direction, thereby relatively moving the ink jet heads and the recording medium with respect to each other.

Then, an ink jet recording apparatus of line head type is obtained easily.

DESCRIPTION OF THE PREFERRED EMBODIMENTS

Hereinafter, preferred embodiments of the present invention will be described with reference to the accompanying drawings.

First Embodiment

Figure 1:
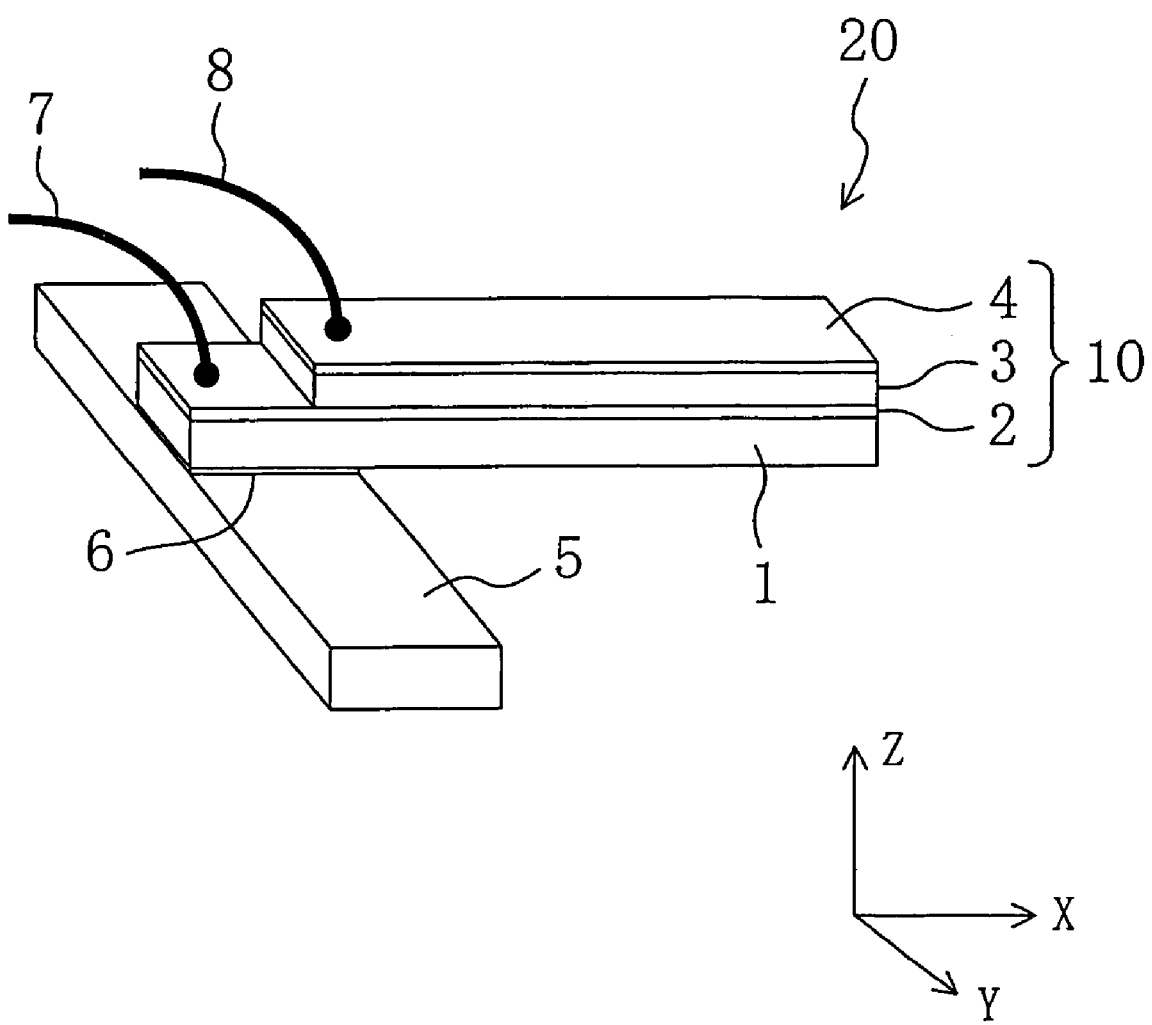
FIG. 1 is a perspective view illustrating a piezoelectric element according to an embodiment of the present invention.

FIG. 1 is a perspective view illustrating a piezoelectric element according to an embodiment of the present invention. As illustrated in FIG. 1, the piezoelectric element 20 of this embodiment includes a substrate 1 made of flat strip shaped silicon (Si) having a length of 11.0 mm, a width of 3.0 mm, and a thickness of 0.30 mm, and a layered structure 10 provided on the substrate 1. A 3.0-mm end portion of the piezoelectric element 20 is fixed, via an epoxy adhesive 6, to a stainless steel support substrate 5 having a length of 10.0 mm, a width of 3.0 mm, and a thickness of 1.0 mm and extending in the direction perpendicular to the piezoelectric element 20 (i.e., the Y axis direction in the coordinate system of FIG. 1). The piezoelectric element 20 is supported by the stainless steel support substrate 5 to form a cantilever.

The layered structure 10 includes a first electrode film 2, a piezoelectric thin film 3, and a second electrode film 4 layered in this order, and is obtained by depositing the first electrode film 2, the piezoelectric thin film 3, and the second electrode film 4 in this order on the substrate 1 by a sputtering method. Note that the deposition method for the first and second electrode films 2 and 4 may be any other suitable method such as a CVD method or a sol-gel method, for example.

The substrate 1 acts as a vibration plate disposed on one surface of the layered structure 10 in the film-layering direction (i.e., one surface of the layered structure 10 closer to the first electrode film 2). Due to the piezoelectric effects of the piezoelectric thin film 3 of the layered structure 10, the piezoelectric thin film 3 expands and contracts in the direction perpendicular to the thickness direction thereof. The expansion and contraction is blocked by the substrate 1 serving as a vibration plate, whereby the tip (i.e., the free end) of the piezoelectric element 20 is displaced in the thickness direction (i.e., the film-layering direction of the layered structure 10). Note that the substrate 1 is not limited to a silicon substrate, but may alternatively be a glass substrate, a ceramic substrate, a metal substrate, or the like.

The first electrode film 2 is made of an iridium (Ir) alloy thin film having a thickness of 0.10 μm and containing 6 mol % of cobalt (Co), and is formed on and entirely across one surface of the substrate 1 in the thickness direction. It should be noted that the first electrode film 2 does not have to be made of a Co-containing iridium alloy. The first electrode film 2 may be made of any metal, but is preferably made of a noble metal to which at least one additive selected from the group consisting of titanium (Ti), aluminum (Al), iron (Fe), cobalt (Co), nickel (Ni), manganese (Mn), copper (Cu), magnesium (Mg), calcium (Ca), strontium (St), barium (Ba) and oxides of these substances has been added, so that, as will be described later, the crystal orientation of the piezoelectric thin film 3 can be controlled in an excellent manner when the piezoelectric thin film 3 is formed on the first electrode film 2.

The piezoelectric thin film 3 is formed across the entire upper surface of the first electrode film 2 excluding the 3.0-mm (base) end portion thereof that is bonded to the stainless steel support substrate 5 (i.e., a portion of the upper surface of the first electrode film 2 having a width of 3.0 mm and a length of 8.0 mm), and is made of an oxide having a perovskite crystalline structure. More specifically, the piezoelectric thin film 3 is made of lead zirconate titanate (PZT) whose composition is expressed by the chemical formula $Pb_{(1-x)}(Zr_{(1-s)}Ti_s)O_3 (0<s<1)$ or is made of lead-zirconate-titanate-based oxide (PZT-based oxide) expressed by the chemical composition formula $(Pb_{(1-x-y)}A_y)(Zr_{(1-s-t)Tis}B_t)O_3$ $(0<s<1, 0<t<1-s)$ where A is a substitutive metal ion in an A-site in the perovskite crystalline structure and B is a substitutive metal ion in a B-site in the perovskite crystalline structure. The value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15. The lead content in the composition of the piezoelectric thin film 3 is thus less than that of the stoichiometric composition. This eliminates, in the grain boundaries in the piezoelectric thin film 3, the existence of lead oxide that undergoes a chemical reaction with water content in the atmosphere. As a result, even if the piezoelectric element is driven by application of a voltage in a high humidity environment, degradation resulting from insulation deterioration does not occur. This effect is obtained more reliably, as the lead content in the piezoelectric thin film 3 becomes smaller (i.e., as the value of x becomes greater). Nevertheless, if the value of x exceeds 0.15, the deposition of the piezoelectric thin film 3 itself becomes difficult, or even if the piezoelectric thin film 3 can be deposited, the piezoelectric characteristics of the film may be insufficient. In view of this, the value of x should not be more than 0.15. Note that the value of x is preferably from 0.03 to 0.15.

The character A in the chemical composition formula of the lead-zirconate-titanate-based oxide is preferably at least one metal ion selected from the group consisting of lanthanum (La), strontium (Sr), bismuth (Bi), and calcium (Ca). The character B in the chemical composition formula is preferably at least one metal ion selected from the group consisting of niobium (Nb), magnesium (Mg), nickel (Ni), manganese (Mn), and iron (Fe).

It is preferable that the piezoelectric thin film 3 is preferentially oriented along the (001) plane and that the thickness of the piezoelectric thin film 3 is from 2 µm to 6 µm.

The second electrode film 4 is made of a platinum (Pt) thin film having a thickness of 0.25 µm and formed on the entire surface of the piezoelectric thin film 3. Lead wires 7 and 8 are connected to the first electrode film 2 and the second electrode film 4, respectively. Note that the second electrode film 4 does not have to be made of platinum, but may alternatively be made of any metal.

When a voltage is applied between the first electrode film 2 and the second electrode film 4 of the piezoelectric element 20 via the lead wires 7 and 8, the piezoelectric thin film 3 expands in the X axis direction in the coordinate system of FIG. 1 (i.e., the longitudinal direction of the piezoelectric thin film 3). The amount of expansion $\Delta L(m)$ of the piezoelectric thin film 3 can be expressed as follows:

$$\Delta L = d_{31} \times L \times E/t$$

where E(V) is the applied voltage, t(m) is the thickness of the piezoelectric thin film 3, L(m) is the length of the piezoelectric thin film 3, and $d_{31}$ (pm/V) is the piezoelectric constant of the piezoelectric thin film 3.

The upper portion of the piezoelectric thin film 3 that is attached to the second electrode film 4 having a small thickness expands in the X axis direction, whereas the expansion of the lower portion thereof that is attached to the substrate 1 via the first electrode film 2 is restricted by the thick substrate 1. As a result, the tip end side of the piezoelectric element 20, which is opposite to the base end (the end at which the lead wires 7 and 8 are connected) fixed to the stainless steel support substrate 5, is displaced in the negative direction along the Z axis in the coordinate system of FIG. 1 (the downward direction in FIG. 1). Thus, the tip of the piezoelectric element 20 is vertically reciprocated within a predetermined displacement range by repeating application and removal of a voltage at a constant frequency. The displacement characteristics of the piezoelectric element 20 can be evaluated by measuring the relationship between the applied voltage and the displacement range of the tip of the piezoelectric element 20.

Next, a method for manufacturing the piezoelectric element 20 will be described with reference to FIG. 2A to FIG. 2E.

Figure 2A:
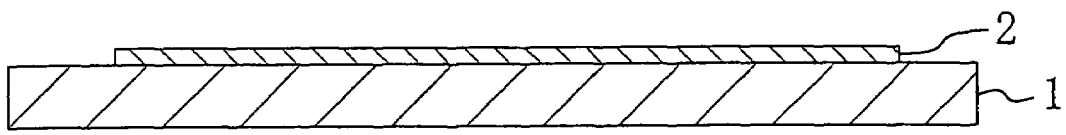
FIGS. 2A through 2E indicate process steps in a method for manufacturing the piezoelectric element of FIG. 1.

First, as illustrated in FIG. 2A, the substrate 1 whose surface has been polished to be a mirror finished surface and which has a size of 20 mm×20 mm and a thickness of 0.30 mm is prepared. The first electrode film 2 is formed by an RF sputtering method on the substrate 1 by using a stainless steel mask (not shown) having a thickness of 0.2 mm and including therein rectangular openings having a width of 5.0 mm and a length of 18.0 mm.

Then, the piezoelectric thin film 3 made of the above-mentioned PZT or PZT-based oxide is formed, by an RF magnetron sputtering method, precisely in a predetermined position on the surface of the first electrode film 2 by using a stainless steel mask (thickness: 0.2 mm) including therein rectangular openings having a width of 5.0 mm and a length of 8.0 mm. In this process step, a sinter target of PZT or PZT-based oxide is used. The piezoelectric thin film 3 is formed under the sputtering conditions in which the potential of the substrate 1 with the first electrode film 2 formed thereon is made to electrically float so as not to be fixed at the ground potential (i.e., the substrate is not grounded and is not electrically connected to any other members) and the sputtering gas pressure is in the range from 0.05 Pa to 0.15 Pa. Alternatively, the piezoelectric thin film 3 may be formed under sputtering conditions in which a bias voltage is applied to the substrate 1 with the first electrode film 2 formed thereon, so that the substrate 1 has a potential equal to the ground potential or has a negative potential lower than the ground potential.

If the piezoelectric thin film 3 is formed under these sputtering conditions, the substrate 1 is subjected to ion bombardment. More specifically, when the substrate is in a state in which its potential floats electrically so as not to be fixed at the ground potential, the sputtering gas pressure is set as small as 0.15 Pa or less (but not less than 0.05 Pa for plasma generation) so that the degree of vacuum during the sputter deposition process is increased, thereby reducing the probability of collision between the sputtered particles and the gas molecules present in the space between the substrate 1 and the target. Alternatively, if the potential of the substrate 1 is made equal to the ground potential or made to be a negative potential lower than the ground potential, the sputtered particles are electrically attracted to the substrate 1, whereby the substrate 1 is subjected to the ion bombardment. Consequently, among the particles of the composition elements ejected from the target onto the substrate 1 by the sputtering gas during the sputter deposition process, the particles of the lead element having a high vapor pressure are reduced in deposition rate. As a result, the piezoelectric thin film 3 expressed by the above chemical composition formula, in which the lead content is small, is formed easily.

As described above, if the first electrode film 2 is made of a noble metal to which an additive such as titanium has been added (cobalt-containing iridium in this embodiment), it becomes easier to preferentially orient the piezoelectric thin film 3 along the (001) plane. More specifically, the additive is present in the form of islands in a dotted pattern on the surface of the first electrode film 2. This additive, which is titanium or the like, easily undergoes oxidation. Thus, even if the additive contained is not in the form of oxide, the additive existing in a dotted pattern on the surface becomes an oxide, if oxygen is present in the piezoelectric thin film 3 formation process step or the like. The piezoelectric thin film 3 is grown over the additive by using, as a nucleus, the additive (oxide) that exists in the form of scattered islands, whereby the piezoelectric thin film 3 is likely to be oriented along the (001) plane over the additive. The first electrode film 2 is normally oriented along the (111) plane, when a silicon substrate or the like is used. Therefore, a region of the piezoelectric thin film 3 above a portion of the surface of the first electrode film 2 where the additive does not exist may be oriented in a direction other than along the (001) plane (e.g., along the (111) plane) or may be amorphous. However, such a region that is not oriented along the (001) plane is present only in the vicinity of the surface of the piezoelectric thin film 3 that is closer to the first electrode film 2 (such a region is about 20 nm deep at the most from the surface). More specifically, since the (001)-oriented region on the additive grows while expanding gradually, the area of that region in cross section perpendicular to the thickness direction increases in the direction going from the first electrode film 2 side toward the opposite side (i.e., the second electrode film 4 side). Due to this, the area of the region not oriented in the (001) plane decreases. As a result, when the thickness of the piezoelectric thin film 3 is about 20 nm, the (001)-oriented region extends substantially across the entire surface.

Figure 2B:
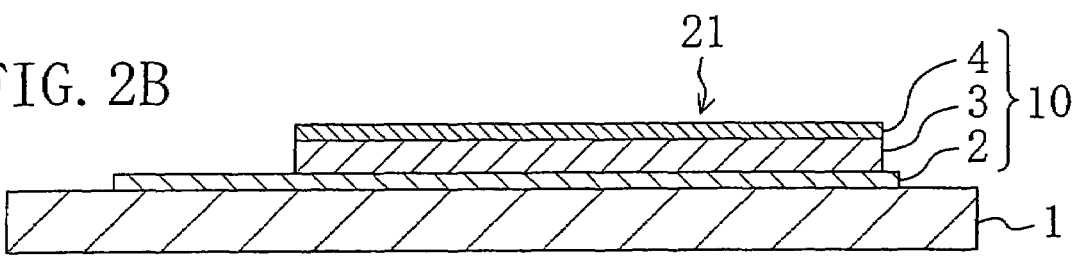

Then, the second electrode film 4 is formed, by an RF sputtering method, on the surface of the piezoelectric thin film 3 by using a stainless steel mask of the same shape as that of the mask used in the formation of the piezoelectric thin film 3, thereby obtaining a structure 21 in which the layered structure 10 including the piezoelectric thin film 3 is provided on the substrate 1, as illustrated in FIG. 2B.

Figure 2C:
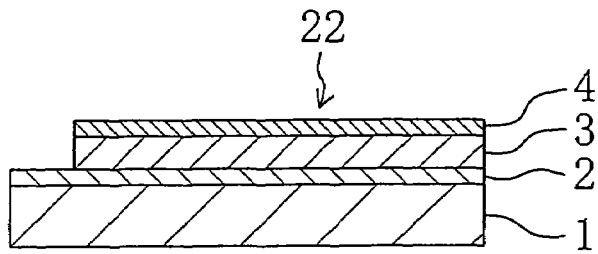

Then, as illustrated in FIG. 2C, the structure 21 is cut by a dicing saw into a strip-shaped piece having a width of 3.0 mm and a length of 11.0 mm so that a portion of the first electrode film 2 is exposed in a square portion having a size of 3.0 mm×3.0 mm at one end of the strip-shaped piece. This strip-shaped piece is a piezoelectric element precursor 22 in which the second electrode film 4 is exposed over the remaining portion having a width of 3.0 mm and a length of 8.0 mm.

Figure 2D:
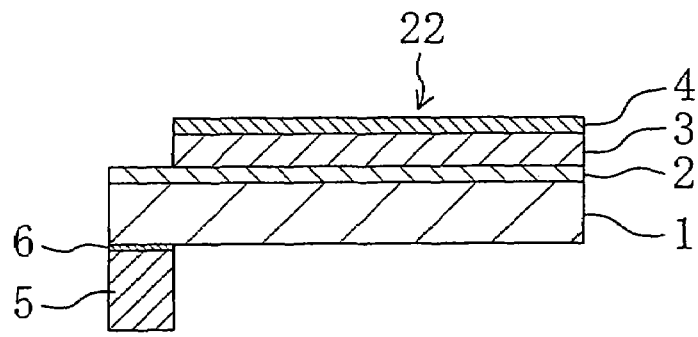

Then, as illustrated in FIG. 2D, one end of the substrate 1 of the piezoelectric element precursor 22 is bonded to the stainless steel support substrate 5 by using the epoxy adhesive 6.

Figure 2E:
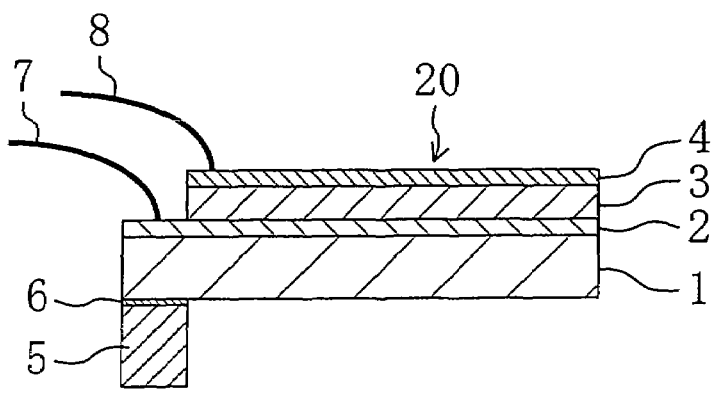

Next, as illustrated in FIG. 2E, the lead wire 7 having a diameter of 0.1 mm and made of gold is connected to an exposed portion of the first electrode film 2 of the piezoelectric element precursor 22 by using a conductive adhesive (silver paste), and the lead wire 8, similar to the lead wire 7, is connected to one end of the second electrode film 4 that is closer to the exposed portion of the first electrode film 2 by wire bonding, thereby obtaining the piezoelectric element 20.

In this embodiment, since the lead content in the composition of the piezoelectric thin film 3 is made smaller as compared to the stoichiometric composition, lead oxide which undergoes a chemical reaction with water content in the atmosphere is not present in the grain boundaries in the piezoelectric thin film 3. As a result, even if the piezoelectric element is driven by application of a voltage in a high humidity environment, degradation resulting from insulation deterioration does not occur. Moreover, the piezoelectric thin film 3 having the low-lead-content composition is easily obtained just by setting the sputtering conditions appropriately as described above. Accordingly, the highly reliable piezoelectric element 20 is obtained easily.

Hereinafter, specific examples of this embodiment will be described.

EXAMPLE 1

A substrate 1 was a silicon substrate having the same shape as that employed in the above-described embodiment. As in the above embodiment, a first electrode film 2 was an iridium alloy thin film having a thickness of 0.10 µm and containing 6 mol % of cobalt. Using an RF magnetron sputtering apparatus, the iridium alloy thin film was deposited through a sputtering process by applying a high-frequency power of 200 W to a 6 mol %-cobalt-containing iridium plate serving as the target of the sputtering apparatus for 16 minutes, while keeping the temperature of the silicon substrate at 400° C. in a mixed gas of argon and oxygen (gas volume ratio: $Ar:O_2=15:1$) serving as the sputtering gas at a total gas pressure of 0.25 Pa. In this film deposition process, in the sputtering apparatus, the potential of the silicon substrate was kept electrically floating so as not to be fixed at the ground potential.

A piezoelectric thin film 3 was a PZT thin film preferentially oriented along the (001) plane. The PZT thin film was formed using an RF magnetron sputtering apparatus. Specifically, as a target, a 6-inch-diameter sinter target made of PZT of stoichiometric composition (the composition mole ratio was Pb:Zr:Ti=1.00:0.53:0.47) was used. The PZT thin film was deposited through a sputtering process for 50 minutes in a deposition chamber in which the PZT target was placed, while keeping the temperature of the silicon substrate with the iridium alloy thin film formed thereon, at 580° C. In the deposition process, a mixed gas of argon and oxygen was used as the sputtering gas, the mixture ratio was argon: oxygen=79:1, the flow rate was 40 ml per minute, the sputtering gas pressure was kept at 0.15 Pa, and the plasma generating power was 3 kW. During the film deposition process, in the sputtering apparatus, the potential of the silicon substrate was kept electrically floating so as not to be fixed at the ground potential.

Furthermore, as a second electrode film 4, a platinum thin film having a thickness of 0.25 µm as in the above-described embodiment is formed by an RF sputtering method.

In order to obtain the precise thickness and crystalline structure of the PZT thin film, a layered film sample was also prepared at the same time by ending the film deposition process without forming the second electrode film 4 after the formation of the PZT thin film. The sample was subjected to an analysis by an X-ray diffraction method and a composition analysis with an X-ray microanalyzer. Thereafter, the sample was broken and the obtained fractured section was observed by a scanning electron microscope, thereby measuring the thickness accurately.

As a result of the analysis of the sample by an X-ray diffraction method, it was found that the PZT thin film was a film having a perovskite crystalline structure and preferentially oriented along the (001) plane (the (001) crystalline orientation degree was 96%) (i.e., a thin film whose <001> axis extends perpendicular to the surface thereof). Herein, the (001) crystalline orientation degree is the proportion (in percent) of the peak intensity of the (001) plane with respect to the sum of peak intensities from the (001), (100), (010), (110), (011), (101) and (111) planes as read from the X-ray diffraction pattern of the thin film.

Moreover, the composition analysis with an X-ray microanalyzer showed that the composition of the PZT thin film was Pb:Zr:Ti=0.99:0.53:0.47. Specifically, the composition is expressed by the chemical composition formula $Pb_{(1-x)}(Zr_{(1-s)}Ti_s)O_3$ where x=0.01 (i.e., $Pb_{0.99}(Zr_{0.53}Ti_{0.47})O_3$). From this, it was found that as compared with the target composition, the amounts of Zr and Ti contained in the composition of the PZT thin film were the same but the amount of Pb was smaller than 1.00.

Furthermore, the observation of the fractured section of the sample by the scanning electron microscope showed that the thickness of the PZT thin film was 3.5 μm.

The piezoelectric element 20 prepared in the above manner was evaluated. More specifically, a triangular voltage with a maximum voltage of 0 V and a minimum voltage of −25 V was applied via lead wires 7 and 8 between the first electrode film 2 and the second electrode film 4 of the piezoelectric element 20 so as to measure the amount of displacement in up-and-down movement of the tip of the piezoelectric element 20 in the Z axis direction by using a laser Doppler vibration and displacement meter.

Figure 3:
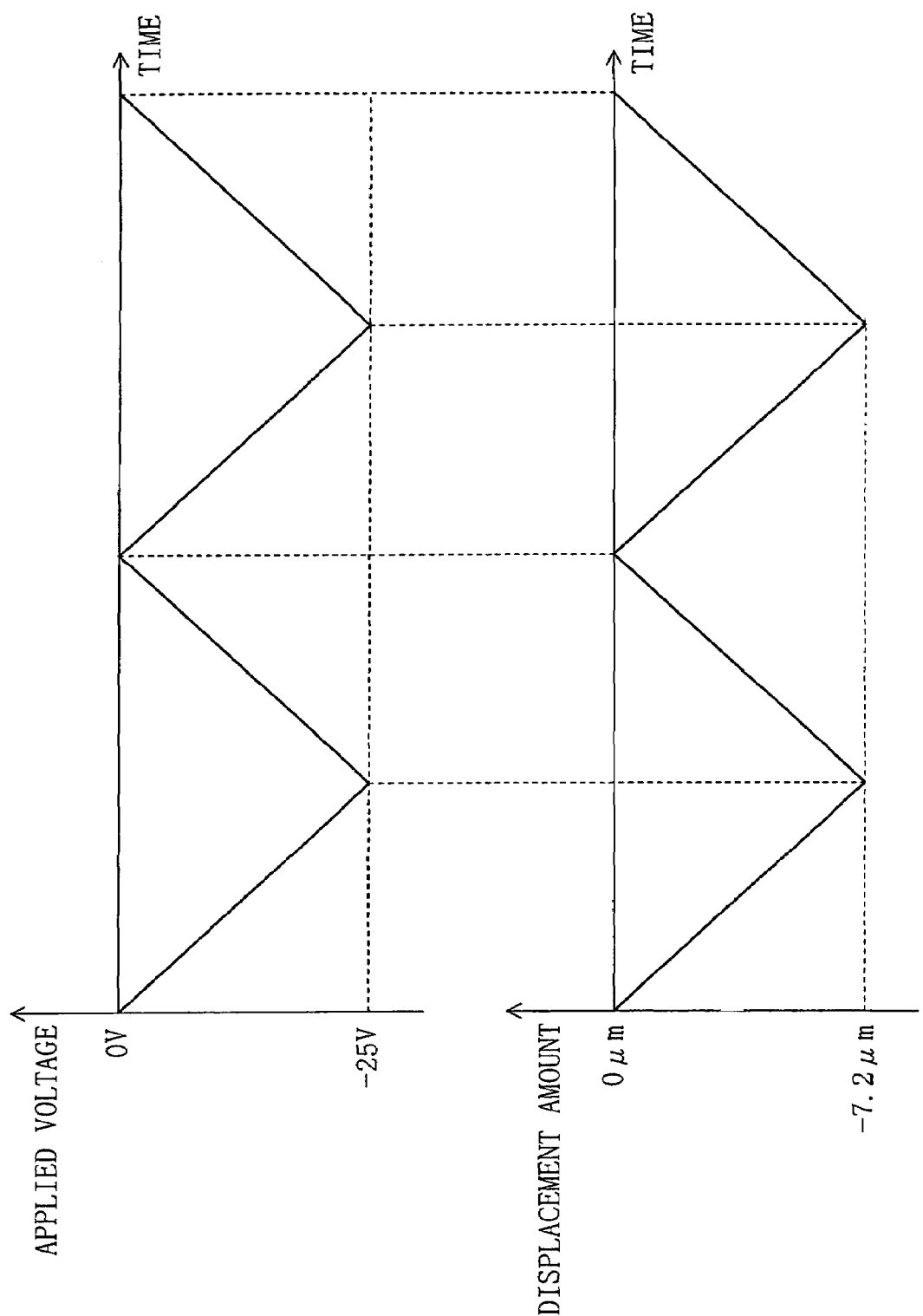
FIG. 3 is a diagram illustrating the amount of displacement of the tip of a piezoelectric element of Example 1 in response to a triangular voltage applied between first and second electrode films of the piezoelectric element.

FIG. 3 illustrates the amount of displacement in the up-and-down movement of the tip of the piezoelectric element 20 in the Z axis direction in response to the triangular voltage applied at a frequency of 2 kHz. As illustrated in FIG. 3, when the applied voltage changed from 0 V to −25 V, the tip of the piezoelectric element 20 was linearly displaced from 0 μm to −7.2 μm in proportion to the applied voltage.

The piezoelectric element 20 prepared in the above manner was placed in a thermostatic high humidity chamber held in an atmosphere in which the temperature was 35 C.° and the relative humidity was 80%, and a direct voltage of 35 V was then applied between the first electrode film 2 and the second electrode film 4 to perform a durability test for 200 hours. Elapsed time since the start of the voltage application and the value of leakage current at the respective elapsed time were measured.

The durability test results showed that the leakage current value was 0.3 nA at the measurement start time, 0.8 nA after one hour, 3 nA after 100 hours, and 3 nA after 200 hours. The leakage current value did not exceed 3 nA, indicating that the reliability was very high.

Moreover, the external appearance of the electrode film surfaces of the piezoelectric element 20 was observed after the 200-hour durability test by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 2

In this example, the sputtering gas pressure, a sputtering deposition condition employed in formation of a piezoelectric thin film 3 (PZT thin film), was changed to 0.12 Pa, and in the other respects, a piezoelectric element 20 was prepared in the same manner as in Example 1.

As a result of an analysis by an X-ray diffraction method, it was found that the PZT thin film of the piezoelectric element 20 obtained in this manner was a film having a perovskite crystalline structure and preferentially oriented along the (001) plane (the (001) crystalline orientation degree was 96%). Moreover, results of a composition analysis with an X-ray microanalyzer showed that the composition of the PZT thin film was expressed by $Pb_{(1-x)}(Zr_{(1-s)}Ti_s)O_3$ where x=0.03 (i.e., $Pb_{0.97}(Zr_{0.53}Ti_{0.47})O_3$). Furthermore, as a result of observation by a scanning electron microscope, it was found that the thickness of the PZT thin film was 3.5 μm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0 V to −25 V, the tip of the piezoelectric element 20 was linearly displaced from 0 μm to −7.2 μm in proportion to the applied voltage.

As in Example 1, the piezoelectric element 20 was subjected to a durability test performed in a thermostatic high humidity chamber in which the temperature was 35 C.° and the relative humidity was 80%. The test results showed that the value of leakage current was 0.3 nA, 0.8 nA, 3 nA, and 3 nA at the measurement start time, after one hour, after 100 hours, and after 200 hours, respectively. This indicates that the piezoelectric element 20 of this example had reliability equal to that of the piezoelectric element 20 of Example 1.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 3

In this example, the sputtering gas pressure, a sputtering deposition condition employed in formation of a piezoelectric thin film 3 (PZT thin film), was changed to 0.09 Pa, and in the other respects, a piezoelectric element 20 was prepared in the same manner as in Example 1.

As a result of an analysis by an X-ray diffraction method, it was found that the PZT thin film of the piezoelectric thin film 3 obtained in this manner was a film having a perovskite crystalline structure and preferentially oriented along the (001) plane (the (001) crystalline orientation degree was 96%). Moreover, results of a composition analysis with an X-ray microanalyzer showed that the composition of the PZT thin film was expressed by $Pb_{(1-x)}(Zr_{(1-s)}Ti_s)O_3$ where x=0.04 (i.e., $Pb_{0.96}(Zr_{0.53}Ti_{0.47})O_3$). Furthermore, as a result of observation by a scanning electron microscope, it was found that the thickness of the PZT thin film was 3.7 μm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0 V to −25V, the tip of the piezoelectric element 20 was linearly displaced from 0 μm to −7.0 μm in proportion to the applied voltage.

As in Example 1, the piezoelectric element 20 was subjected to a durability test performed in a thermostatic high humidity chamber in which the temperature was 35 C.° and the relative humidity was 80%. The test results showed that the value of leakage current was 0.4 nA, 0.8 nA, 3 nA, and 3 nA at the measurement start time, after one hour, after 100 hours, and after 200 hours, respectively. This indicates that the piezoelectric element 20 of this example had reliability equal to that of the piezoelectric element 20 of Example 1.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 4

In this example, the sputtering gas pressure, a sputtering deposition condition employed in formation of a piezoelectric thin film 3 (PZT thin film), was changed to 0.07 Pa, which was a value close to the limit beyond which stable plasma generation became impossible in the employed RF magnetron sputtering apparatus. In the other respects, a piezoelectric element 20 was prepared in the same manner as in Example 1.

As a result of an analysis by an X-ray diffraction method, it was found that the PZT thin film of the piezoelectric element 20 obtained in this manner was a film having a perovskite crystalline structure and preferentially oriented along the (001) plane (the (001) crystalline orientation degree was 96%). Moreover, results of a composition analysis with an X-ray microanalyzer showed that the composition of the PZT thin film was expressed by $Pb_{(1-x)}(Zr_{(1-s)}Ti_s)O_3$ where x=0.04 (i.e., $Pb_{0.96}(Zr_{0.53}Ti_{0.47})O_3$). Furthermore, as a result of observation by a scanning electron microscope, it was found that the thickness of the PZT thin film was 3.8 μm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0 V to −25V, the tip of the piezoelectric element 20 was linearly displaced from 0 μm to −6.9 μm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.3 nA, 0.8 nA, 3 nA, and 3 nA at the measurement start time, after one hour, after 100 hours, and after 200 hours, respectively. This indicates that the piezoelectric element 20 of this example had reliability equal to that of the piezoelectric element 20 of Example 1.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 5

In this example, the sputtering time for depositing a piezoelectric thin film 3 (PZT thin film) by sputtering was changed to 30 minutes, and in the other respects, a piezoelectric element 20 was prepared in the same manner as in Example 1.

As a result of an analysis by an X-ray diffraction method, it was found that the PZT thin film of the piezoelectric element 20 obtained in this manner was a film having a perovskite crystalline structure and preferentially oriented along the (001) plane (the (001) crystalline orientation degree was 95%). Moreover, results of a composition analysis with an X-ray microanalyzer showed that the composition of the PZT thin film was expressed by $Pb_{(1-x)}(Zr_{(1-s)}Ti_s)O_3$ where x=0.01 (i.e., $Pb_{0.99}(Zr_{0.53}Ti_{0.47})O_3$). Furthermore, as a result of observation by a scanning electron microscope, it was found that the thickness of the PZT thin film was 2.0 μm.

Then, a triangular voltage with a maximum voltage of 0 V and a minimum voltage of −15 V was applied between the first electrode film 2 and the second electrode film 4 of the piezoelectric element 20 so as to measure the amount of displacement in up-and-down movement of the tip of the piezoelectric element 20. When the applied voltage changed from 0 V to −15V, the tip of the piezoelectric element 20 was linearly displaced from 0 μm to −4.0 μm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.5 nA, 2.2 nA, 5 nA, and 5 nA at the measurement start time, after one hour, after 100 hours, and after 200 hours, respectively. This indicates that the piezoelectric element 20 of this example had high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 6

In this example, the sputtering time for depositing a piezoelectric thin film 3 (PZT thin film) by sputtering was changed to 85 minutes, and in the other respects, a piezoelectric element 20 was prepared in the same manner as in Example 1.

As a result of an analysis by an X-ray diffraction method, it was found that the PZT thin film of the piezoelectric element 20 obtained in this manner was a film having a perovskite crystalline structure and preferentially oriented along the (001) plane (the (001) crystalline orientation degree was 96%). Moreover, results of a composition analysis with an X-ray microanalyzer showed that the composition of the PZT thin film was expressed by $Pb_{(1-x)}(Zr_{(1-s)}Ti_s)O_3$ where x=0.01 (i.e., $Pb_{0.99}(Zr_{0.53}Ti_{0.47})O_3$). Furthermore, as a result of observation by a scanning electron microscope, it was found that the thickness of the PZT thin film was 6.0 μm.

Then, a triangular voltage with a maximum voltage of 0 V and a minimum voltage of −40 V was applied between the first electrode film 2 and the second electrode film 4 of the piezoelectric element 20 so as to measure the amount of displacement in up-and-down movement of the tip of the piezoelectric element 20. When the applied voltage changed from 0 V to −40V, the tip of the piezoelectric element 20 was linearly displaced from 0 μm to −11.6 μm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.3 nA, 1.0 nA, 3 nA, and 3 nA at the measurement start time, after one hour, after 100 hours, and after 200 hours, respectively. This indicates that the piezoelectric element 20 of this example had very high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 7

In this example, a piezoelectric thin film 3 (PZT thin film) was deposited by sputtering in the following manner. In the other respects, a piezoelectric element 20 was prepared in the same manner as in Example 1.

More specifically, in this example, in forming the PZT thin film using an RF magnetron sputtering apparatus, a 6-inch-diameter sinter target made of PZT containing an excessive amount of Pb in its composition as compared with the stoichiometric composition (the composition mole ratio was Pb:Zr:Ti=1.20:0.53:0.47) was used as a target. In a deposition chamber in which the PZT target was placed, a silicon substrate with a first electrode film 2 (an iridium alloy thin film) formed thereon was attached onto a metal substrate holder and a ground wire was attached to the substrate holder for connection to the ground potential. This allowed the silicon substrate, over which the PZT thin film was to be formed, to have the same potential as the ground potential. Subsequently, the PZT thin film was deposited through a sputtering process for 50 minutes under the conditions in which a mixed gas of argon and oxygen was used as the sputtering gas, the mixture ratio of argon to oxygen was 79 to 1, the flow rate was 40 ml per minute, the sputtering gas pressure was at 0.30 Pa, and the plasma generating power was 3 kW, while keeping the temperature of the silicon substrate at 560° C.

As a result of an analysis by an X-ray diffraction method, it was found that the PZT thin film of the piezoelectric element 20 prepared in this manner was a film having a perovskite crystalline structure and preferentially oriented along the (001) plane (the (001) crystalline orientation degree was 90%). Moreover, results of a composition analysis with an X-ray microanalyzer showed that the composition of the PZT thin film was expressed by $Pb_{(1-x)}(Zr_{(1-s)}Ti_s)O_3$ where x=0.08 (i.e., $Pb_{0.92}(Zr_{0.53}Ti_{0.47})O_3$). Furthermore, as a result of observation by a scanning electron microscope, it was found that the thickness of the PZT thin film was 3.2 μm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0V to −25V, the tip of the piezoelectric element 20 was linearly displaced from 0 μm to −6.5 μm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.3 nA, 0.9 nA, 2 nA, and 2 nA at the measurement start time, after one hour, after 100 hours, and after 200 hours, respectively. This indicates that the piezoelectric element 20 of this example had very high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 8

In this example, the substrate 1 was changed to a pyrex glass substrate (coning # 7059). In the other respects, a piezoelectric element 20 was prepared in the same manner as in Example 7.

As a result of an analysis by an X-ray diffraction method, it was found that the piezoelectric thin film 3 (the PZT thin film) of the piezoelectric element 20 prepared in this manner was a film having a perovskite crystalline structure and preferentially oriented along the (001) plane (the (001) crystalline orientation degree was 92%). Moreover, results of a composition analysis with an X-ray microanalyzer showed that the composition of the PZT thin film was expressed by $Pb_{(1-x)}(Zr_{(1-s)}Ti_s)O_3$ where x=0.08 (i.e., $Pb_{0.92}(Zr_{0.53}Ti_{0.47})O_3$). Furthermore, as a result of observation by a scanning electron microscope, it was found that the thickness of the PZT thin film was 3.3 µm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0V to −25V, the tip of the piezoelectric element 20 was linearly displaced from 0 µm to −9.3 µm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.3 nA, 0.8 nA, 2 nA, and 2 nA at the measurement start time, after one hour, after 100 hours, and after 200 hours, respectively. This indicates that the piezoelectric element 20 of this example had very high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 9

In this example, the substrate 1 was changed to a substrate having a mirror finished surface and made of an alumina sinter, which is a ceramic material. In the other respects, a piezoelectric element 20 was prepared in the same manner as in Example 7.

As a result of an analysis by an X-ray diffraction method, it was found that the piezoelectric thin film 3 (the PZT thin film) of the piezoelectric element 20 prepared in this manner was a film having a perovskite crystalline structure and preferentially oriented along the (001) plane (the (001) crystalline orientation degree was 92%). Moreover, results of a composition analysis with an X-ray microanalyzer showed that the composition of the PZT thin film was expressed by $Pb_{(1-x)}(Zr_{(1-s)}Ti_s)O_3$ where x=0.08 (i.e., $Pb_{0.92}(Zr_{0.53}Ti_{0.47})O_3$). Furthermore, as a result of observation by a scanning electron microscope, it was found that the thickness of the PZT thin film was 3.2 µm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0V to −25V, the tip of the piezoelectric element 20 was linearly displaced from 0 µm to −5.0 µm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.3 nA, 0.8 nA, 2 nA, and 2 nA at the measurement start time, after one hour, after 100 hours, and after 200 hours, respectively. This indicates that the piezoelectric element 20 of this example had very high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 10

In this example, the piezoelectric thin film 3 is a film made of a PZT-based oxide in which La, Sr, Mg, and Nb have been added to PZT, and when the piezoelectric thin film 3 (PZT-based oxide) is formed, a sinter target (of 6-inch diameter) made of a PZT-based oxide of stoichiometric composition to which La, Sr, Mg and Nb have been added was used as a sputtering target. In the other respects, a piezoelectric element 20 was prepared in the same manner as in Example 2. The chemical composition of the target was expressed by $(Pb_{0.94}La_{0.01}Sr_{0.05})(Zr_{0.50}Ti_{0.46}Mg_{0.02}Nb_{0.02})O_3$.

As a result of an analysis by an X-ray diffraction method, it was found that the PZT-based oxide thin film of the piezoelectric element 20 prepared in this manner was a film having a perovskite crystalline structure and preferentially oriented along the (001) plane (the (001) crystalline orientation degree was 89%). Moreover, results of a composition analysis with an X-ray microanalyzer showed that the composition of the PZT-based oxide thin film was expressed by $(Pb_{(1-x-y)}A_y)(Zr_{(1-s-t)Tis}B_t)O_3$ where A is a substitutive metal ion in an A-site in the perovskite crystalline structure, B is a substitutive metal ion in a B-site of the perovskite crystalline structure, and x=0.03 (i.e., $(Pb_{0.91}La_{0.01}Sr_{0.05})(Zr_{0.50}Ti_{0.46}Mg_{0.02}Nb_{0.02})O_3$). Furthermore, as a result of observation by a scanning electron microscope, it was found that the thickness of the PZT-based oxide thin film was 3.4 µm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0 V to −25 V, the tip of the piezoelectric element 20 was linearly displaced from 0 µm to −8.5 µm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.4 nA, 1.2 nA, 5 nA, and 5 nA at the measurement start time, after one hour, after 100 hours, and after 200 hours, respectively. This indicates that the piezoelectric element 20 of this example had high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 11

In this example, the piezoelectric thin film 3 is a film made of a PZT-based oxide in which Ca, Ni, Mn, and Nb have been added to PZT, and when the piezoelectric thin film 3 (PZT-based oxide) is formed, a sinter target (of 6-inch diameter) made of a PZT-based oxide of stoichiometric composition to which Ca, Ni, Mn, and Nb have been added was used as a sputtering target. In the other respects, a piezoelectric element 20 was prepared in the same manner as in Example 2. The chemical composition of the target was expressed by $(Pb_{0.98}Ca_{0.02})(Zr_{0.50}Ti_{0.46}Ni_{0.01}Mn_{0.01}Nb_{0.02})O_3$.

As a result of an analysis by an X-ray diffraction method, it was found that the PZT-based oxide thin film of the piezoelectric element 20 prepared in this manner was a film having a perovskite crystalline structure and preferentially oriented along the (001) plane (the (001) crystalline orientation degree was 85%). Moreover, results of a composition analysis with an X-ray microanalyzer showed that the composition of the PZT-based oxide thin film was expressed by $(Pb_{(1-x-y)}A_y)(Zr_{(1-s-t)}Ti_sB_t)O_3$ where A is a substitutive metal ion in an A-site in the perovskite crystalline structure, B is a substitutive metal ion in a B-site of the perovskite crystalline structure, and x=0.02 (i.e., $(Pb_{0.96}Ca_{0.02})(Zr_{0.50}Ti_{0.46}Ni_{0.01}Mn_{0.01}Nb_{0.02})O_3$). Furthermore, as a result of observation by a scanning electron microscope, it was found that the thickness of the PZT-based oxide thin film was 3.3 µm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0 V to −25 V, the tip of the piezoelectric element 20 was linearly displaced from 0 µm to −8.2 µm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.4 nA, 1.2 nA, 5 nA, and 5 nA at the measurement start time, after one hour, after 100 hours, and after 200 hours, respectively. This indicates that the piezoelectric element 20 of this example had high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 12

In this example, the piezoelectric thin film 3 is a film made of a PZT-based oxide in which Bi, Fe, and Nb have been added to PZT, and when the piezoelectric thin film 3 (PZT-based oxide) is formed, a sinter target (of 6-inch diameter) made of a PZT-based oxide of stoichiometric composition to which Bi, Fe, and Nb have been added was used as a sputtering target. In the other respects, a piezoelectric element 20 was prepared in the same manner as in Example 7. The chemical composition of the target was expressed by $(Pb_{0.99}Bi_{0.01})(Zr_{0.50}Ti_{0.46}Fe_{0.02}Nb_{0.02})O_3$.

As a result of an analysis by an X-ray diffraction method, it was found that the PZT-based oxide thin film of the piezoelectric element 20 obtained in this manner was a film having a perovskite crystalline structure and preferentially oriented along the (001) plane (the (001) crystalline orientation degree was 93%). Moreover, results of a composition analysis with an X-ray microanalyzer showed that the composition of the PZT-based oxide thin film was expressed by $(Pb_{(1-x-y)}A_y)(Zr_{(1-s-t)}Ti_sB_t)O_3$ where A is a substitutive metal ion in an A-site in the perovskite crystalline structure, B is a substitutive metal ion in a B-site of the perovskite crystalline structure, and x=0.08 (i.e., $(Pb_{0.91}Bi_{0.01})(Zr_{0.50}Ti_{0.46}Fe_{0.02}Nb_{0.02})O_3$). Furthermore, as a result of observation by a scanning electron microscope, it was found that the thickness of the PZT-based oxide thin film was 3.4 µm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0 V to −25V, the tip of the piezoelectric element 20 was linearly displaced from 0 µm to −8.4 µm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 1.0 nA, 3.2 nA, 6 nA, and 6 nA at the measurement start time, after one hour, after 100 hours, and after 200 hours, respectively. This indicates that the piezoelectric element 20 of this example had high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 13

In this example, a piezoelectric thin film 3 (PZT thin film) was deposited by sputtering in the following manner. In the other respects, a piezoelectric element 20 was prepared in the same manner as in Example 1.

More specifically, in this example, in forming the PZT thin film using an RF magnetron sputtering apparatus, a 6-inch-diameter sinter target made of PZT containing an excessive amount of Pb in its composition as compared with the stoichiometric composition (the composition mole ratio was Pb:Zr:Ti=1.20:0.53:0.47) was used as a target. In a deposition chamber in which the PZT target was placed, a silicon substrate with a first electrode film 2 (an iridium alloy thin film) formed thereon was attached onto a substrate holder made of metal, and one end of a lead wire was attached to the substrate holder and the other end of the lead wire was attached to a DC power supply so as to allow the DC power supply to apply to the substrate holder (i.e., the silicon substrate) a negative bias voltage of −200 V with respect to the ground potential. In this way, the potential of the silicon substrate, over which the PZT thin film was to be formed, was kept at −200 V with respect to the ground potential. Subsequently, the PZT thin film was formed through a sputtering process for 50 minutes under the conditions in which a mixed gas of argon and oxygen was used as the sputtering gas, the mixture ratio of argon to oxygen was 79 to 1, the flow rate was 40 ml per minute, the sputtering gas pressure was at 0.30 Pa, and the plasma generating power was 3 kW, while keeping the temperature of the silicon substrate at 560° C.

As a result of an analysis by an X-ray diffraction method, it was found that the PZT thin film of the piezoelectric element 20 prepared in this manner was a film having a perovskite crystalline structure and preferentially oriented along the (001) plane (the (001) crystalline orientation degree was 96%). Moreover, results of a composition analysis with an X-ray microanalyzer showed that the composition of the PZT thin film was expressed by $Pb_{(1-x)}(Zr_{(1-s)}Ti_s)O_3$ where x=0.13 (i.e., $Pb_{0.87}(Zr_{0.53}Ti_{0.47})O_3$). Furthermore, as a result of observation by a scanning electron microscope, it was found that the thickness of the PZT thin film was 3.1 μm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0 V to −25V, the tip of the piezoelectric element 20 was linearly displaced from 0 μm to −6.2 μm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.3 nA, 0.8 nA, 2 nA, and 2nA at the measurement start time, after one hour, after 100 hours, and after 200 hours, respectively. This indicates that the piezoelectric element 20 of this example had very high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

EXAMPLE 14

In this example, a piezoelectric element 20 was prepared under the same conditions as those of Example 13 except that the negative bias voltage applied to the substrate during the sputtering deposition process for the piezoelectric thin film 3 (PZT thin film) was changed to −300 V.

As a result of an analysis by an X-ray diffraction method, it was found that the PZT thin film of the piezoelectric element 20 prepared in this manner was a film having a perovskite crystalline structure and preferentially oriented along the (001) plane (the (001) crystalline orientation degree was 97%). Moreover, results of a composition analysis with an X-ray microanalyzer showed that the composition of the PZT thin film was expressed by $Pb_{(1-x)}(Zr_{(1-s)}Ti_s)O_3$ where x=0.15 (i.e., $Pb_{0.85}(Zr_{0.53}Ti_{0.47})O_3$). Furthermore, as a result of observation by a scanning electron microscope, it was found that the thickness of the PZT thin film was 2.9 μm.

Then, a triangular voltage with a maximum voltage of 0 V and a minimum voltage of −25 V was applied between the first electrode film 2 and the second electrode film 4 of the piezoelectric element 20 so as to measure the amount of displacement in up-and-down movement of the tip of the piezoelectric element 20. When the applied voltage changed from 0V to −25V, the tip of the piezoelectric element 20 was linearly displaced from 0 μm to −6.4 μm in proportion to the applied voltage.

As in Example 1, the piezoelectric element 20 was subjected to a durability test performed in a thermostatic high humidity chamber in which the temperature was 35 C.° and the relative humidity was 80%. From the test results, it was found that the value of leakage current was 0.3 nA, 0.8 nA, 2 nA, and 2 nA at the measurement start time, after one hour, after 100 hours, and after 200 hours, respectively. This indicates that the piezoelectric element 20 of this example had very high reliability.

Moreover, the external appearance of the electrode film surfaces of the piezoelectric element 20 after the 200-hour durability test was observed by an optical microscope. No changes such as cracks or coloring were observed.

Furthermore, the piezoelectric element 20 after the 200-hour durability test was driven by application of the same triangular voltage as that applied before the durability test, so as to examine relationship between the applied voltage and the amount of displacement. It was confirmed that the same characteristics as those obtained before the durability test were achieved and no deterioration occurred.

COMPARATIVE EXAMPLE 1

For comparison purpose, a piezoelectric element, having a piezoelectric thin film made of PZT with a Pb content that exceeded the stoichiometric composition, was prepared. Specifically, in forming the piezoelectric thin film (PZT thin film), a PZT sinter target having a composition (with an excessive Pb content) whose mole ratio was expressed as Pb:Zr:Ti=1.20:0.53:0.47 was used as the sputter target and the sputtering time was 50 minutes. In the other respects, the piezoelectric element was prepared in the same manner as in Example 1.

As a result of an analysis by an X-ray diffraction method, it was found that the PZT thin film of the piezoelectric element obtained in this manner was a film having a perovskite crystalline structure and preferentially oriented along the (001) plane (the (001) crystalline orientation degree was 99%). Moreover, results of a composition analysis with an X-ray microanalyzer showed that the composition of the PZT thin film was expressed by $Pb_{(1-x)}(Zr_{(1-s)}Ti_s)O_3$ where $x=-0.10$ (i.e., $Pb_{1.1}(Zr_{0.53}Ti_{0.47})O_3$). Furthermore, as a result of observation by a scanning electron microscope, it was found that the thickness of the PZT thin film was 3.8 μm.

Then, a triangular voltage with a maximum voltage of 0 V and a minimum voltage of −25 V was applied between a first electrode film and a second electrode film of the piezoelectric element so as to measure the amount of displacement in up-and-down movement of the tip of the piezoelectric element. When the applied voltage changed from 0 V to −25V, the tip of the piezoelectric element was linearly displaced from 0 μm to −8.7 μm in proportion to the applied voltage.

As in Example 1, the piezoelectric element was subjected to a durability test performed in a thermostatic high humidity chamber in which the temperature was 35 C.° and the relative humidity was 80%. The value of leakage current was 0.5 nA at the measurement start time, but the leakage current value measured after one hour was 10000 nA (=10 mA), and after 100 hours, the leakage current value exhibited more than 100 mA, which means that the insulation was destroyed.

Moreover, the external appearance of the electrode film surfaces of the piezoelectric element after the 100-hour durability test was observed by an optical microscope. The surfaces were blackened everywhere and innumerable hollows were observed in those blackened portions. Furthermore, the current leakage in the piezoelectric element after the 100-hour durability test was so significant as described above that a driving test was impossible.

COMPARATIVE EXAMPLE 2

In Comparative example 2, the sputtering gas pressure, a sputtering deposition condition employed in formation of a piezoelectric thin film (PZT thin film), was changed to 0.2 Pa, and in the other respects, a piezoelectric element was prepared in the same manner as in Example 1.

As a result of an analysis by an X-ray diffraction method, it was found that the PZT thin film of the piezoelectric element obtained in this manner was a film having a perovskite crystalline structure and preferentially oriented along the (001) plane (the (001) crystalline orientation degree was 97%). Moreover, results of a composition analysis with an X-ray microanalyzer showed that the composition of the PZT thin film was expressed by $Pb_{(1-x)}(Zr_{(1-s)}Ti_s)O_3$ where $x=0.00$ (i.e., $Pb_{1.00}(Zr_{0.53}Ti_{0.47})O_3$). Furthermore, as a result of observation by a scanning electron microscope, it was found that the thickness of the PZT thin film was 3.5 μm.

Then, a triangular voltage with a maximum voltage of 0 V and a minimum voltage of −25 V was applied between a first electrode film and a second electrode film of the piezoelectric element so as to measure the amount of displacement in up-and-down movement of the tip of the piezoelectric element. When the applied voltage changed from 0 V to −25V, the tip of the piezoelectric element was linearly displaced from 0 μm to −7.6 μm in proportion to the applied voltage.

As in Example 1, the piezoelectric element was subjected to a durability test performed in a thermostatic high humidity chamber in which the temperature was 35 C.° and the relative humidity was 80%. From the test results, it was found that the value of leakage current, which was 0.5 nA at the measurement start time, was 10000 nA (=10 mA) after one hour, and after 100 hours, the leakage current value exhibited more than 100 mA and the insulation was destroyed.

Moreover, the external appearance of the electrode film surfaces of the piezoelectric element after the 100-hour durability test was observed by an optical microscope. As in Comparative example 1, the surfaces were blackened everywhere and innumerable hollows were observed in those blackened portions. Furthermore, the current leakage in the piezoelectric element after the 100-hour durability test was so significant as described above that a driving test was impossible.

Therefore, it is found that if the lead content in the piezoelectric thin film 3 is made smaller ($0<x \leq 0.15$) than the stoichiometric composition as in Examples 1 through 14, the piezoelectric element having high reliability in which no dielectric breakdown occurs is obtained.

In this embodiment and the examples thereof, the substrate 1 acts as a film deposition substrate and also as a vibration plate. However, the film deposition substrate and the vibration plate may be separate members. In that case, the first electrode film 2 is formed on the substrate 1, the piezoelectric thin film 3 is formed on the first electrode film 2, the second electrode film 4 is formed on the piezoelectric thin film 3 (i.e., the layered structure 10 is formed on the substrate 1), and the vibration plate is formed on the second electrode film 4. After all of these films have been deposited, the substrate 1 is removed. Then, the vibration plate is provided on the surface of the layered structure 10 that is closer to the second electrode film 4.

Second Embodiment

Next, an ink jet head using the layered structure of the piezoelectric element of the present invention will be described.

Figure 4:
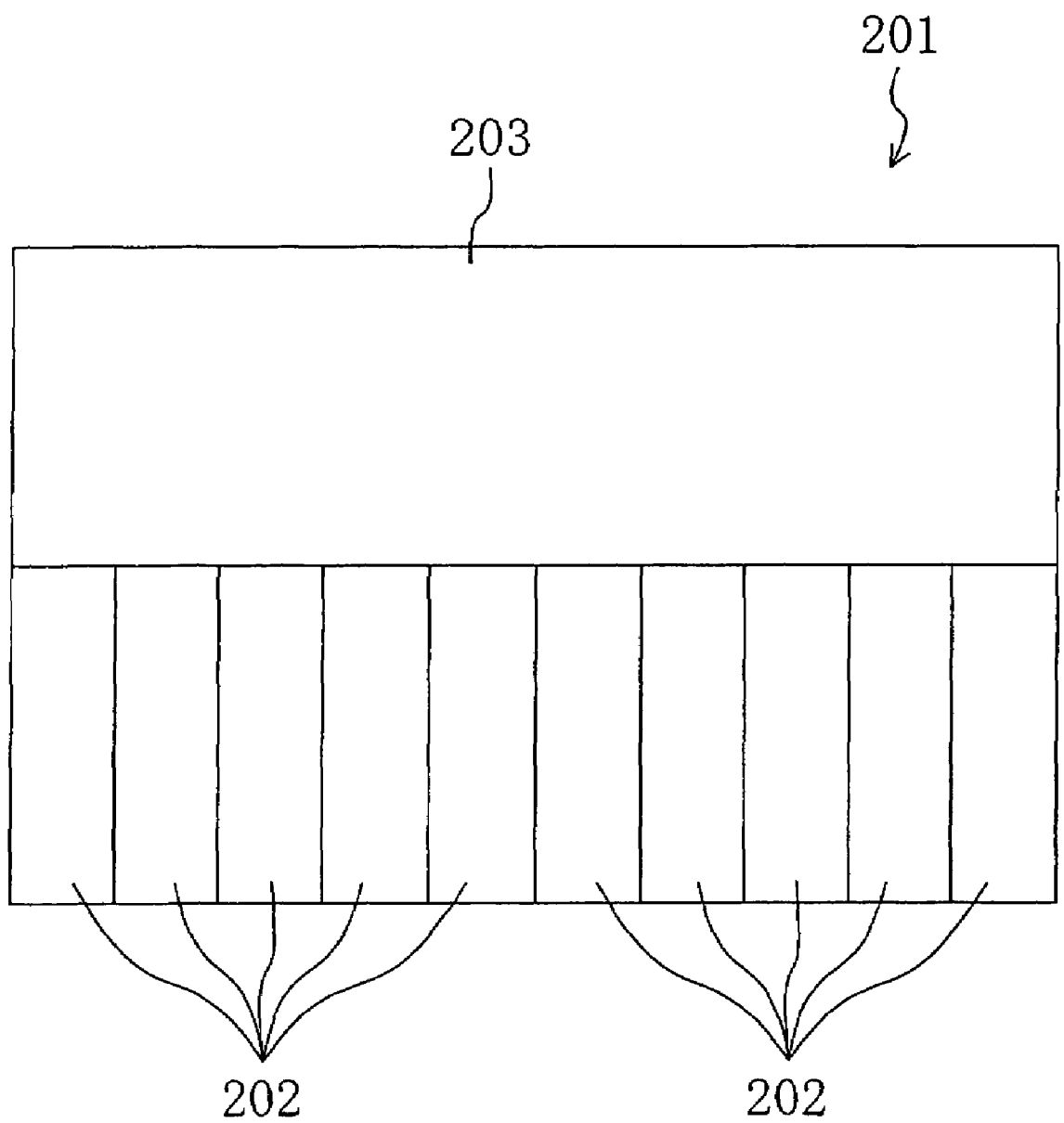
FIG. 4 is a schematic diagram illustrating an ink jet head according to an embodiment of the present invention.

FIG. 4 is a schematic view illustrating the structure of an ink jet head 201 according to an embodiment of the present invention. As illustrated in FIG. 4, the ink jet head 201 of the present embodiment includes a plurality of (ten in FIG. 4) ink discharging elements 202 of the same shape arranged in a row, and a driving power supply element 203 such as an IC chip for driving the ink discharging elements 202.

Figure 5:
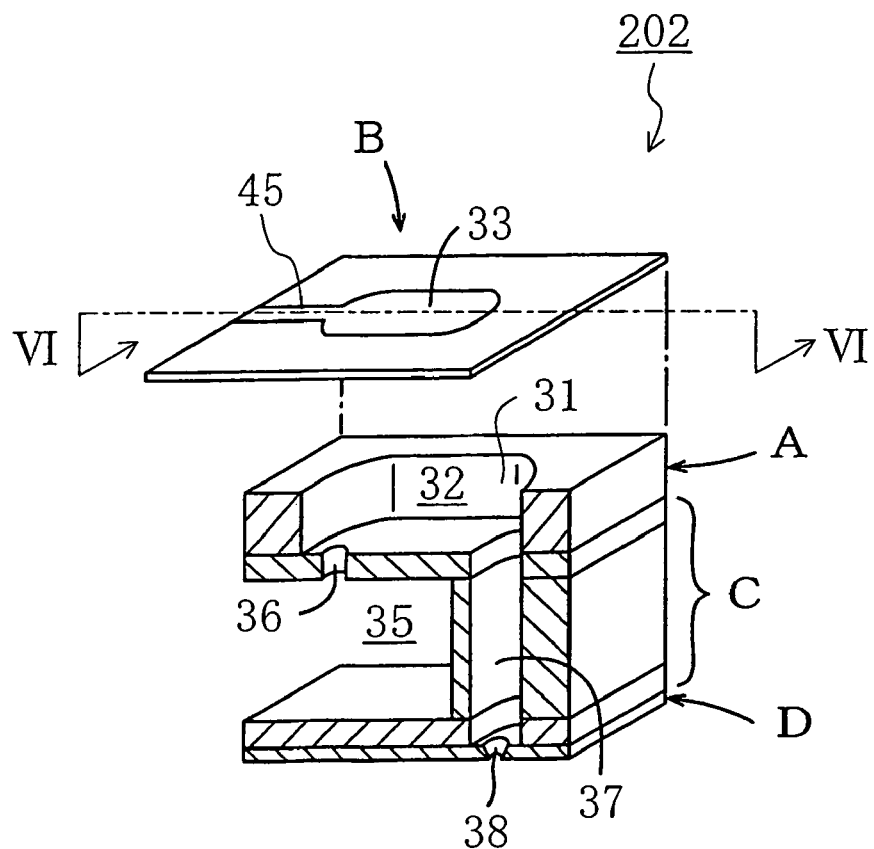
FIG. 5 is a partially-cutaway perspective view illustrating an ink discharging element of the ink jet head of FIG. 4.

FIG. 5 is a partially-cutaway perspective view illustrating the structure of one ink discharging element 202. In FIG. 5, the reference character A denotes a pressure chamber member made of a glass, and a pressure chamber cavity 31 is formed in the pressure chamber member A. The reference character B denotes an actuator section placed so as to cover the upper opening (having an elliptical shape whose minor axis is 200 μm long and whose major axis is 400 μm long) of the pressure chamber cavity 31, and the reference character C denotes an ink channel member placed so as to cover the lower opening of the pressure chamber cavity 31. Thus, the pressure chamber cavity 31 of the pressure chamber member A is defined by the actuator section B and the ink channel member C, placed on and under the pressure chamber member A, respectively, thereby forming a pressure chamber 32 (depth: 0.2 mm).

The actuator section B includes a first electrode film 33 (separate electrode) above each pressure chamber 32. The position of the first electrode film 33 generally corresponds to that of the pressure chamber 32. Moreover, the ink channel member C includes: a common ink chamber 35 shared by the pressure chambers 32 of the plurality of ink discharging elements 202 arranged in the ink supply direction; a supply port 36 via which the common ink chamber 35 is communicated to the pressure chamber 32 so that ink in the common ink chamber 35 is supplied into the pressure chamber 32; and an ink channel 37 through which ink in the pressure chamber 32 is discharged. Furthermore, the reference character D denotes a nozzle plate. The nozzle plate D includes a nozzle 38 (a nozzle hole of a diameter of 30 μm) which is communicated to the pressure chamber 32 via the ink channel 37. The pressure chamber member A, the actuator section B, the ink channel member C and the nozzle plate D are bonded together by an adhesive, thus forming the ink discharging element 202.

In the present embodiment, the pressure chamber member A, the actuator section B (except for the first electrode film 33 and a piezoelectric thin film 41 (see FIG. 6)), the ink channel member C and the nozzle plate D are formed as an integral member across all of the ink discharging elements 202, and each ink discharging element 202 is defined as a portion of the integral member including one pressure chamber 32, and the nozzle 38, the first electrode film 33 and the piezoelectric thin film 41 that correspond to the pressure chamber 32. Note that the ink discharging elements 202 may alternatively be formed separately and then attached together. Moreover, the ink jet head 201 does not have to be formed of a plurality of ink discharging elements 202, but may alternatively be formed of a single ink discharging element 202.

The driving power supply element 203 is connected to each of the first electrode films 33 of the actuator sections B of the plurality of ink discharging elements 202 via bonding wires, so that a voltage is supplied to each first electrode film 33 from the driving power supply element 203.

Figure 6:
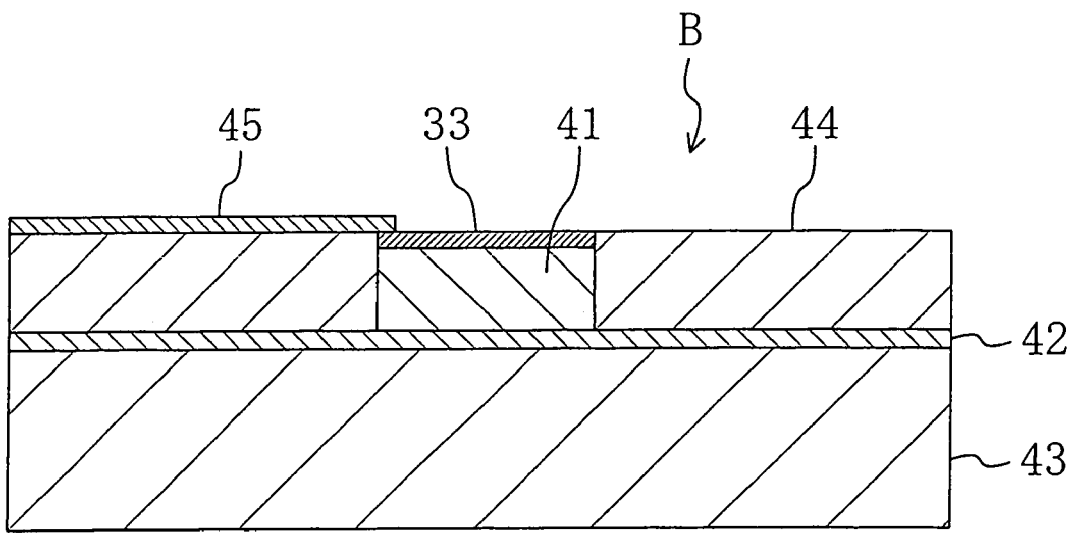
FIG. 6 is a cross-sectional view taken along the line VI-VI of FIG. 5.

Next, the structure of the actuator section B will be described with reference to FIG. 6. FIG. 6 is a cross-sectional view, taken along the line VI-VI of FIG. 5, illustrating the actuator section B of the ink discharging element 202 of FIG. 5. As illustrated in FIG. 6, the actuator section B includes the first electrode films 33 each located above one pressure chamber 32 so that the position of the first electrode film 33 generally corresponds to that of the pressure chamber 32, the piezoelectric thin film 41 provided on (under, as shown in the figure) each first electrode film 33, a second electrode film 42 (common electrode) provided on (under) the piezoelectric thin films 41 and shared by all of the piezoelectric thin films 41 (by all of the ink discharging elements 202), and a vibration plate 43 (a vibration plate film, in this embodiment) which is provided on (under) the second electrode film 42 across the entire surface thereof, and is displaced and vibrates in the thickness direction by the piezoelectric effect of the piezoelectric thin films 41. As is the second electrode film 42, the vibration plate 43 is also shared by the pressure chambers 32 of the ink discharging elements 202 (i.e., the vibration plate 43 is formed as an integral member across all of the ink discharging elements 202).

The first electrode film 33, the piezoelectric thin film 41 and the second electrode film 42 are layered in this order to form a layered structure. This layered structure and the vibration plate 43 provided on one surface of the layered structure (i.e., one surface of the layered structure closer to the second electrode film 42) in the film-layering direction form a piezoelectric element (piezoelectric actuator).

As in the first embodiment, the first electrode film 33 is made of an iridium alloy thin film having a thickness of 0.10 μm and containing 6 mol % of cobalt (Co). Also in this embodiment, the first electrode film 33 may be made of any metal, but is preferably made of a noble metal to which at least one additive selected from the group consisting of titanium (Ti), aluminum (Al), iron (Fe), cobalt (Co), nickel (Ni), manganese (Mn), copper (Cu), magnesium (Mg), calcium (Ca), strontium (St), barium (Ba) and oxides of these substances has been added, so that, as will be described later, the crystal orientation of the piezoelectric thin film 41 can be controlled in an excellent manner when the piezoelectric thin film 41 is formed on the first electrode film 33.

In this embodiment, the piezoelectric thin film 41 is a PZT thin film which is expressed by $Pb_{0.97}(Zr_{0.53}Ti_{0.47})O_3$. As described in the first embodiment, the piezoelectric thin film 41 may be made of any oxide having a perovskite crystalline structure so long as the oxide is made of PZT whose composition is expressed by the chemical formula $Pb_{(1-x)}(Zr_{(1-s)}Ti_s)O_3$ ($0<s<1$) or PZT-based oxide expressed by the chemical composition formula $(Pb_{(1-x-y)}A_y)(Zr_{(1-s-t)}Ti_sB_t)O_3$ ($0<s<1$, $0<t<1-s$) and the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15 (preferably from 0.03 to 0.15).

The character "A" in the chemical composition formula of the lead-zirconate-titanate-based oxide is preferably at least one metal ion selected from the group consisting of lanthanum (La), strontium (Sr), bismuth (Bi), and calcium (Ca). The character "B" in the chemical composition formula is preferably at least one metal ion selected from the group consisting of niobium (Nb), magnesium (Mg), nickel (Ni), manganese (Mn), and iron (Fe).

It is preferable that the piezoelectric thin film 41 is preferentially oriented along the (001) plane (the (001) crystalline orientation degree is 96% in this embodiment) and that the thickness of the piezoelectric thin film 41 is from 2 μm to 6 μm (5 μm in this embodiment).

The second electrode film 42 is made of a platinum thin film having a thickness of 0.15 μm. However, the second electrode film 42 may alternatively be made of any metal in this embodiment.

In this embodiment, the vibration plate 43 is made of a chromium (Cr) film having a thickness of 3.5 μm. Note that the material of the vibration plate 43 is not limited to Cr, but may alternatively be metal material such as nickel, or silicon, glass, or ceramic material.

On the second electrode film 42, an electrically insulative organic film 44 made of a polyimide resin is provided so as to surround the first electrode film 33 and the piezoelectric thin film 41 and so that the upper surface thereof is flush with the upper surface of the first electrode film 33. On the upper surface of the electrically insulative organic film 44, an extraction electrode film 45 made of a gold thin film (thickness: 0.10 μm) having a lead wire shape extends from the first electrode film 33.

Next, a method for manufacturing the ink jet head 201 will be described with reference to FIG. 7A to FIG. 7I.

Figure 7A:
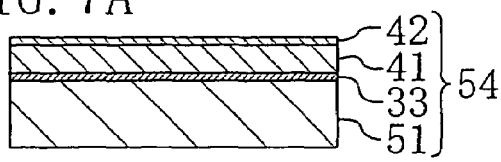
FIGS. 7A through 7I indicate process steps in a method for manufacturing the ink jet head of FIG. 4.

First, as illustrated in FIG. 7A, the first electrode film 33, the piezoelectric thin film 41 and the second electrode film 42 are deposited in this order on a silicon substrate 51 having a length of 20 mm, a width of 20 mm and a thickness of 0.3 mm, thereby obtaining a structure 54, as in Example 3 of the first embodiment.

Figure 7B:
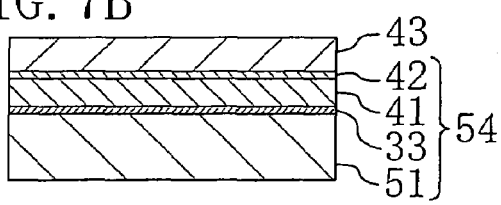

Then, as illustrated in FIG. 7B, the vibration plate 43 made of a chromium film is formed on the second electrode film 42 of the structure 54 by an RF sputtering method at a room temperature.

Figure 7C:
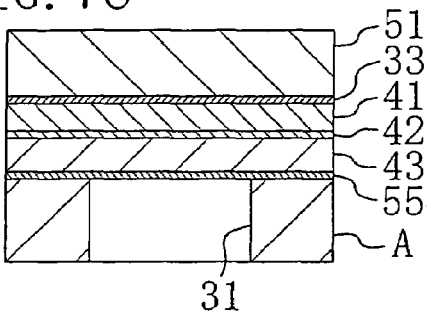

Next, as illustrated in FIG. 7C, the structure 54, on which the vibration plate 43 has been formed, is bonded to the pressure chamber member A by using an adhesive (acrylic resin) 55. Specifically, the pressure chamber member A, in which the pressure chamber cavity 31 has been formed in advance, is bonded on the surface of the vibration plate 43 that is away from the second electrode film 42.

Figure 7D:
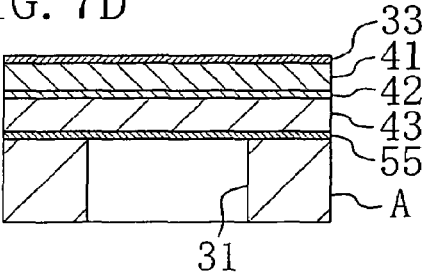

Then, as illustrated in FIG. 7D, the silicon substrate 51 is removed by dry etching with an $SF_6$ gas using a plasma reactive etching apparatus.

Figure 7E:
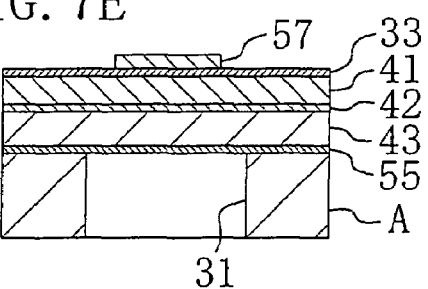

Then, as illustrated in FIG. 7E, a photoresist resin film 57 is applied on a portion of the surface of the first electrode film 33 that is not to be etched, in preparation for patterning the first electrode film 33 and the piezoelectric thin film 41 into an elliptical pattern (an elliptical shape whose minor axis is 180 μm long and whose major axis is 380 μm long).

Figure 7F:
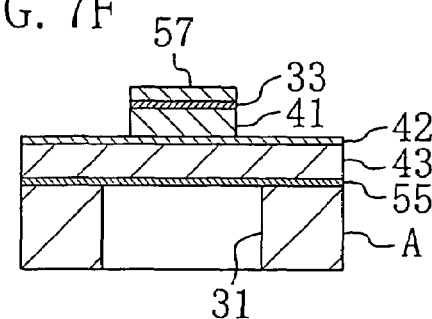
Figure 7G:
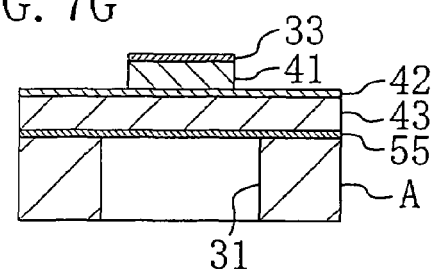

Then, as illustrated in FIG. 7F, the first electrode film 33 and the piezoelectric thin film 41 are patterned into individual portions by an etching process in which dry etching with Ar gas and wet etching with dilute hydrogen fluoride are performed. Then, as illustrated in FIG. 7G, the photoresist resin film 57 is removed by using a resist stripper solution.

Figure 7H:
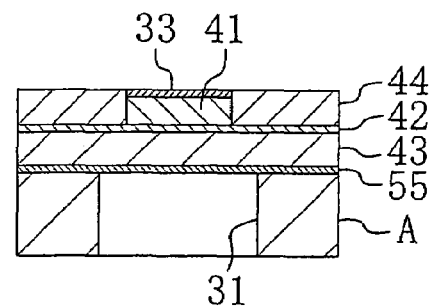
Figure 7I:
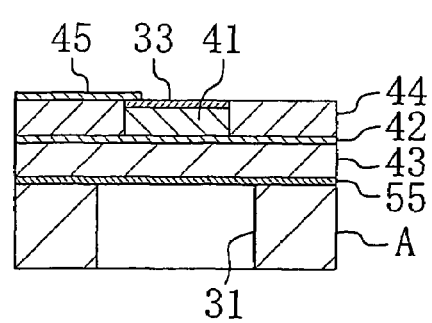

Then, as illustrated in FIG. 7H, the electrically insulative organic film 44 made of a polyimide resin is formed by a printing method on a portion of the second electrode film 42 that has been exposed through the patterning process described above. Then, as illustrated in FIG. 7I, the extraction electrode film 45 made of a gold thin film having a lead wire shape is formed by a DC sputtering method on the upper surface of the electrically insulative organic film 44, thus obtaining the actuator section B.

On the other hand, although not shown in the figure, the ink channel member C, in which the common ink chamber 35, the supply port 36 and the ink channel 37 have been formed in advance, and the nozzle plate D, in which the nozzle hole 38 has been formed in advance, are bonded to each other by using an adhesive. Then, the pressure chamber member A, which has been bonded to the actuator section B, and the ink channel member C, to which the nozzle plate D has been bonded, are aligned with each other and then bonded together by using an adhesive. Thus, the ink jet head 201 is obtained.

In the ink jet head 201 having such a structure as described above, a voltage is supplied to each of the first electrode films 33 of the plurality of ink discharging elements 202 from the driving power supply element 203 via a bonding wire, and the vibration plate 43 bonded to the second electrode film 42 serving as a common electrode is displaced and vibrates in the thickness direction by the piezoelectric effect of the piezoelectric thin films 41, whereby the volumetric capacity of the pressure chambers 32 increases or decreases. When the volumetric capacity of the pressure chambers 32 decreases, ink in the pressure chambers 32 is discharged through the nozzles 38 via the ink channels 37. On the other hand, when the volumetric capacity of the pressure chambers 32 increases, ink in the common ink chamber 35 is supplied into the pressure chambers 32 via the supply ports 36. In the ink jet head 201, the piezoelectric thin films 41, which form the actuator sections B of the ink discharging elements 202, contain a smaller amount of lead as compared with the stoichiometric composition. Thus, the electrical insulation does not deteriorate, even if a voltage is applied in a high humidity environment. As a result, even if the ink discharging elements 202 are driven by applying a high voltage, failure resulting from deterioration in electrical insulation is not likely to occur. This enables the highly reliable, stable driving in which piezoelectric displacement is not likely to decrease. Since the amount of piezoelectric displacement directly affects the ink-discharge performance, it is possible to easily make an adjustment so as to suppress the deviation in the ink discharge among the plurality of ink discharging elements 202 by adjusting the power supply voltage.

An ink jet head 201 including 30 ink discharging elements 202 of the same shape was actually produced by the above-mentioned manufacturing method, and a sine-wave voltage (200 Hz) with a maximum voltage of 0 V and a minimum voltage of −25 V was applied between two electrode films 33 and 42 interposing a piezoelectric thin film 41 therebetween, in a high humidity environment in which the temperature was 35 C.° and the relative humidity was 80%, so as to vibrate the vibration plate 43 one billion times. No failure occurred in all of the ink discharging elements 202.

In this embodiment, the substrate 51 is used only as a film deposition substrate and removed after the film deposition process. Alternatively, the pressure chamber member A may be used also as a film deposition substrate. In that case, on the pressure chamber member A in which no pressure chamber cavity 31 is formed, the vibration plate 43, the first electrode film 33 (common electrode), the piezoelectric thin film 41, and the second electrode film 42 (separate electrode) may be deposited in this order, and after these films have been disposed, the pressure chamber cavity 31 may be formed in the pressure chamber member A. Then, the vibration plate 43 is provided on the surface of the layered structure that is closer to the first electrode film 33.

Third Embodiment

Figure 8:
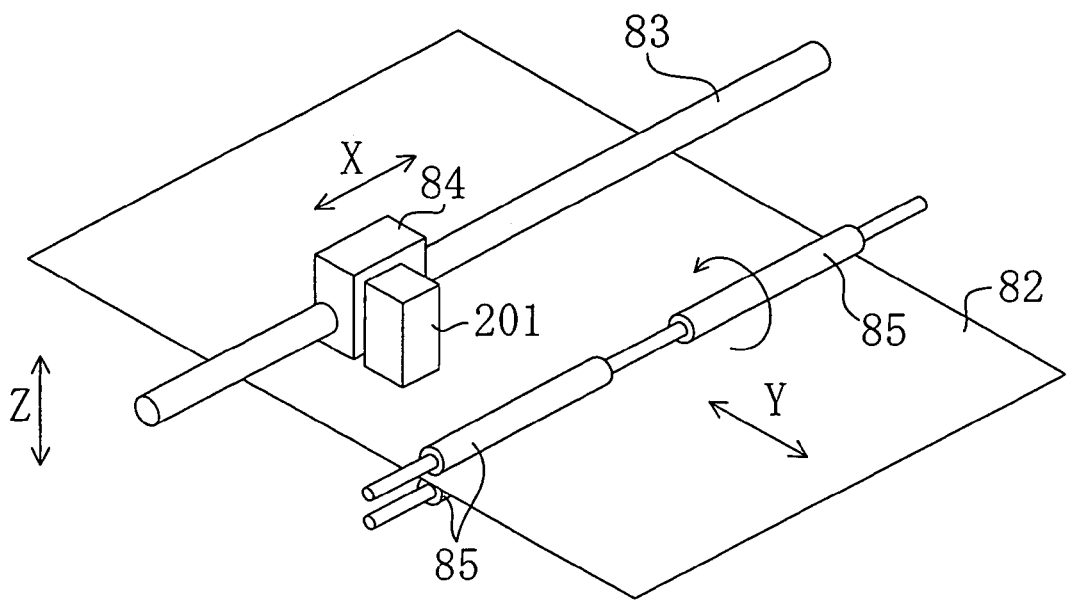
FIG. 8 is a perspective view schematically illustrating an ink jet recording apparatus according to an embodiment of the present invention.

FIG. 8 illustrates an ink jet recording apparatus 81 according to an embodiment of the present invention. The ink jet recording apparatus 81 includes the ink jet head 201 described in the second embodiment. In the ink jet head 201, ink in each pressure chamber 32 is discharged through the nozzle 38 provided to be communicated to the pressure chamber 32, so as to land on a recording medium 82 (e.g., recording paper), thus recording information thereon.

The ink jet head 201 is mounted on a carriage 84, which is provided slidable on a carriage shaft 83 extending in the primary scanning direction (the direction X in FIG. 8), and is reciprocated in the primary scanning direction X as the carriage 84 reciprocates along the carriage shaft 83. Thus, the carriage 84 forms relative movement means for relatively moving the ink jet head 201 and the recording medium 82 with respect to each other, while forming head moving means for reciprocating the ink jet head 201 in the predetermined direction (the primary scanning direction X).

Moreover, the ink jet recording apparatus 81 includes a plurality of rollers 85 for moving the recording medium 82 in the secondary scanning direction (the direction Y in FIG. 8), which is substantially perpendicular to the primary scanning direction X of the ink jet head 201. Thus, the plurality of rollers 85 together form relative movement means for relatively moving the ink jet head 201 and the recording medium 82 with respect to each other, while forming recording medium moving means for moving the recording medium 82 in the direction (the secondary scanning direction Y) substantially perpendicular to the predetermined direction. Note that in FIG. 8, an arrow Z represents the vertical direction.

While the ink jet head 201 is moved by the carriage 84 in the primary scanning direction X, ink is discharged through the nozzles 38 of the ink jet head 201 onto the recording medium 82. After one scan of recording operation, the recording medium 82 is moved by the rollers 85 by a predetermined amount, and then the next scan of recording operation is performed.

Thus, by forming the ink jet recording apparatus 81 using the ink jet head 201 of the second embodiment which is highly reliable in terms of environmental resistance and in which the deviation in the ink discharge among the plurality of ink discharging elements 202 can be controlled easily, it is possible to suppress the deviation in the recording operation onto the recording medium 82 such as paper, while improving the reliability of the apparatus.

Fourth Embodiment

Figure 9:
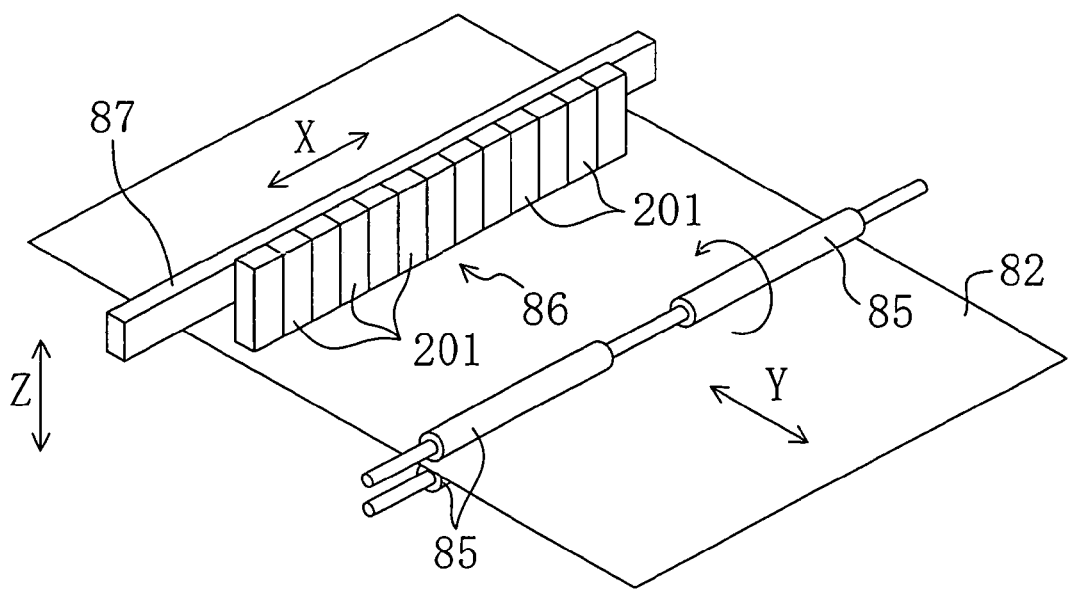
FIG. 9 is a perspective view schematically illustrating another ink jet recording apparatus according to an embodiment of the present invention.

FIG. 9 illustrates another ink jet recording apparatus 91 according to an embodiment of the present invention. The ink jet recording apparatus 91 includes a plurality of (13 in this embodiment) ink jet heads 201 described in the second embodiment. The plurality of ink jet heads 201 are aligned and connected with each other in a predetermined direction (the direction X in FIG. 9), thereby forming a line head 86 consisting of the group of the ink jet heads. The line head 86, supported by a supporting member 87 extending in the predetermined direction, extends in almost the entire width direction of a recording medium 82, so that ink is ejected at the same time onto the recording medium 82 in substantially the entire width direction of the recording medium 82.

The ink jet recording apparatus 91 includes a plurality of rollers 85 for moving the recording medium 82 in a direction (the direction Y in FIG. 9), which is substantially perpendicular to the predetermined direction. Thus, the plurality of rollers 85 together form relative movement means for relatively moving the ink jet heads 201 and the recording medium 82 with respect to each other by moving the recording medium 82 in the direction substantially perpendicular to the predetermined direction. Note that in FIG. 9, an arrow Z represents the vertical direction.

The ink jet recording apparatus 91 performs recording operation by discharging ink through the nozzles 38 of the ink jet heads 201 onto the recording medium 82 while the recording medium 82 is moved by the rollers 85.

In this embodiment as in the third embodiment, since the ink jet heads 201 of the second embodiment that are highly reliable in terms of environmental resistance are used, it is possible to easily control the deviation in the ink discharge among the plurality of ink discharging elements 202 of the ink jet heads 201 of the line head 86, whereby it is possible to suppress the deviation in the recording operation onto the recording medium 82 such as paper, while improving the reliability of the apparatus.

The piezoelectric elements of the present invention are applicable not only to the above-described ink jet heads (ink jet recording apparatuses) but also to gyro devices, MEMS (micro electro mechanical system) devices typified by optical switching components, or the like.

What is claimed is:

1. A piezoelectric element comprising a layered structure in which a first electrode film, a piezoelectric thin film, and a second electrode film are layered in this order,
    wherein the piezoelectric thin film is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3 (0<s<1)$, the lead-zirconate-titanate-based oxide having a chemical composition expressed by a chemical formula $(Pb_{(1-x-y)}A_y)(Zr_{(1-s-t)}Ti_sB_t)O_3(0<s<1, 0<t<1-s)$ where A is a substitutive metal ion in an A-site in the perovskite crystalline structure and B is a substitutive metal ion in a B-site in the perovskite crystalline structure, and
    the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15.

2. The piezoelectric element of claim 1, wherein A in the chemical composition formula of the lead-zirconate-titanate-based oxide is at least one metal ion selected from the group consisting of lanthanum (La), strontium (Sr), bismuth (Bi), and calcium (Ca), and
    B in the chemical composition formula is at least one metal ion selected from the group consisting of niobium (Nb), magnesium (Mg), nickel (Ni), manganese (Mn), and iron (Fe).

3. The piezoelectric element of claim 1, wherein the thickness of the piezoelectric thin film is 2 μm or more but 6 μm or less.

4. The piezoelectric element of claim 1, wherein the piezoelectric thin film is preferentially oriented along a (001) plane.

5. The piezoelectric element of claim 1, wherein a vibration plate is provided on one surface of the layered structure in the film-layering direction.

6. The piezoelectric element of claim 5, wherein the vibration plate is made of at least one material selected from the group consisting of silicon, glass, ceramic material, and metal material.

7. An ink jet head comprising: a piezoelectric element including a layered structure, in which a first electrode film, a piezoelectric thin film and a second electrode film are layered in this order, and a vibration plate provided on one surface of the layered structure in the film-layering direction; a pressure chamber for storing ink therein; and a nozzle communicated to the pressure chamber, the ink jet head being designed so that the vibration plate is displaced in a thickness direction by a piezoelectric effect of the piezoelectric thin film of the piezoelectric element so that the ink in the pressure chamber is discharged through the nozzle,
    wherein the piezoelectric thin film of the piezoelectric element is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3(0<s<1)$, the lead-zirconate-titanate-based oxide having a chemical composition expressed by a chemical formula $(Pb_{(1-x-y)}A_y)(Zr_{(1-s-t)}Ti_sB_t)O_3(0<s<1, 0<t<1-s)$ where A is a substitutive metal ion in an A-site in the perovskite crystalline structure and B is a substitutive metal ion in a B-site in the perovskite crystalline structure, and
    the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15.

8. An ink jet recording apparatus comprising:
    an ink jet head including: a piezoelectric element including a layered structure, in which a first electrode film, a piezoelectric thin film and a second electrode film are layered in this order, and a vibration plate provided on one surface of the layered structure in the film-layering direction; a pressure chamber for storing ink therein; and a nozzle communicated to the pressure chamber; and relative movement means for relatively moving the ink jet head and a recording medium with respect to each other, the ink jet recording apparatus being designed so that while the ink jet head is relatively moved with respect to the recording medium, the vibration plate is displaced in a thickness direction by a piezoelectric effect of the piezoelectric thin film of the piezoelectric element of the ink jet head so that the ink in the pressure chamber is discharged through the nozzle onto the recording medium, thereby recoding information, wherein the piezoelectric thin film of the piezoelectric element of the ink jet head is made of lead zirconate titanate or lead-zirconate-titanate-based oxide, which is an oxide having a perovskite crystalline structure, the lead zirconate titanate having a chemical composition expressed by a chemical formula $Pb_{(1-x)}(Zr_{(1-s)}Ti_s)O_3$ ($0<s<1$), the lead-zirconate-titanate-based oxide having a chemical composition expressed by a chemical formula $(Pb_{(1-x-y)}A_y)(Zr_{(1-s-t)}Ti_sB_t)O_3$ ($0<s<1$, $0<t<1-s$) where A is a substitutive metal ion in an A-site in the perovskite crystalline structure and B is a substitutive metal ion in a B-site in the perovskite crystalline structure, and the value of x in the chemical composition formulas of the lead zirconate titanate and the lead-zirconate-titanate-based oxide, which indicates a deficiency in Pb content in each composition that is a deviation from stoichiometric composition, is more than 0 but not more than 0.15.

9. The ink jet recording apparatus of claim 8, wherein the relative movement means includes head moving means for reciprocating the ink jet head in a predetermined direction and recording medium moving means for moving the recording medium in a direction substantially perpendicular to the predetermined direction, and while the ink jet head is moved in the predetermined direction by the head moving means of the relative movement means, the ink in the pressure chamber is discharged through the nozzle of the ink jet head onto the recording medium, thereby recoding information.

10. The ink jet recording apparatus of claim 8, wherein a plurality of ink jet heads are aligned and connected with each other in a predetermined direction, and relative movement means moves a recording medium in a direction substantially perpendicular to the predetermined direction, thereby relatively moving the ink jet heads and the recording medium with respect to each other.

* * * * *